United States Patent
Lee et al.

(10) Patent No.: US 8,149,622 B2
(45) Date of Patent: Apr. 3, 2012

(54) MEMORY SYSTEM HAVING NAND-BASED NOR AND NAND FLASHES AND SRAM INTEGRATED IN ONE CHIP FOR HYBRID DATA, CODE AND CACHE STORAGE

(75) Inventors: Peter Wung Lee, Saratoga, CA (US); Fu-Chang Hsu, San Jose, CA (US); Kesheng Wang, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 238 days.

(21) Appl. No.: 12/701,509

(22) Filed: Feb. 5, 2010

(65) Prior Publication Data
US 2010/0329011 A1 Dec. 30, 2010

Related U.S. Application Data

(60) Provisional application No. 61/269,894, filed on Jun. 30, 2009.

(51) Int. Cl.
*G11C 16/04* (2006.01)
(52) U.S. Cl. ......... 365/185.18; 365/185.12; 365/185.13; 365/185.17; 365/185.26
(58) Field of Classification Search ............. 365/185.18, 365/185.12, 185.13, 185.26, 185.17
See application file for complete search history.

(56) References Cited

U.S. PATENT DOCUMENTS

| | | | |
|---|---|---|---|
| 5,608,673 A * | 3/1997 | Rhee | 365/185.33 |
| 7,177,190 B2 * | 2/2007 | Lee | 365/185.17 |
| 7,861,139 B2 * | 12/2010 | Murray et al. | 714/763 |
| 7,903,462 B1 * | 3/2011 | Yeung et al. | 365/185.17 |
| 7,952,956 B2 * | 5/2011 | Wang et al. | 365/230.09 |

* cited by examiner

*Primary Examiner* — Pho M Luu
(74) *Attorney, Agent, or Firm* — Lin & Associates IP, Inc.

(57) ABSTRACT

A memory system includes a NAND flash memory, a NOR flash memory and a SRAM memory on a single chip. Both NAND and NOR memories are manufactured by the same NAND manufacturing process and NAND cells. The three memories share the same address bus, data bus, and pins of the single chip. The address bus is bi-directional for receiving codes, data and addresses and transmitting output. The data bus is also bi-directional for receiving and transmitting data. One external chip enable pin and one external output enable pin are shared by the three memories to reduce the number of pins required for the single chip. Both NAND and NOR memories have dual read page buffers and dual write page buffers for Read-While-Load and Write-While-Program operations to accelerate the read and write operations respectively. A memory-mapped method is used to select different memories, status registers and dual read or write page buffers.

73 Claims, 17 Drawing Sheets

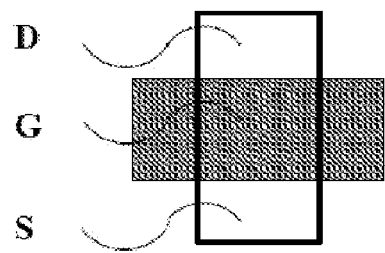 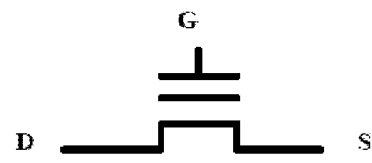
(A)                    (B)
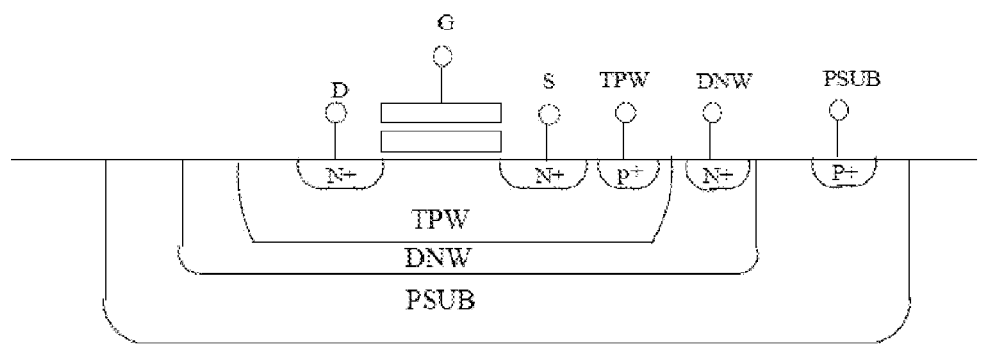
(C)
FIG. 1
(Prior Art)

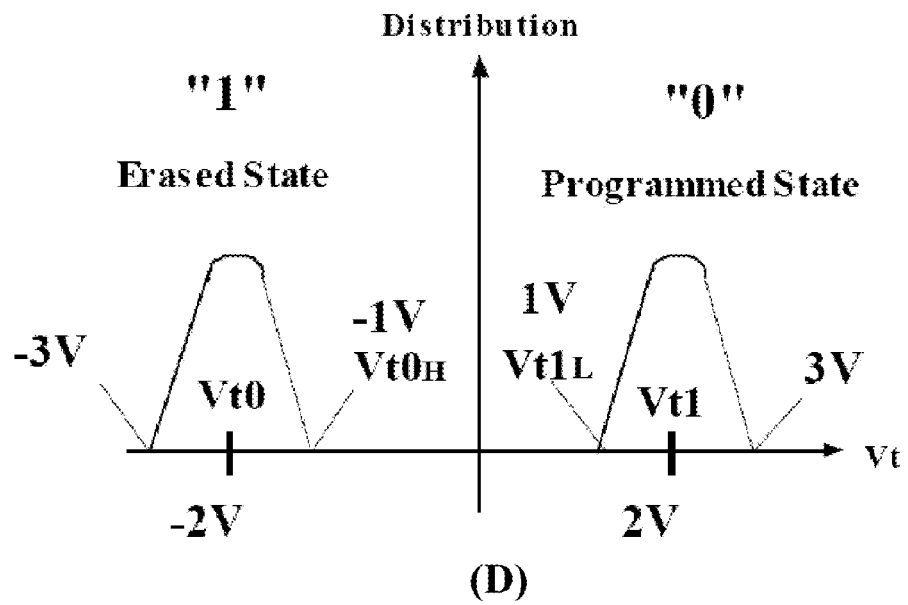
(D)
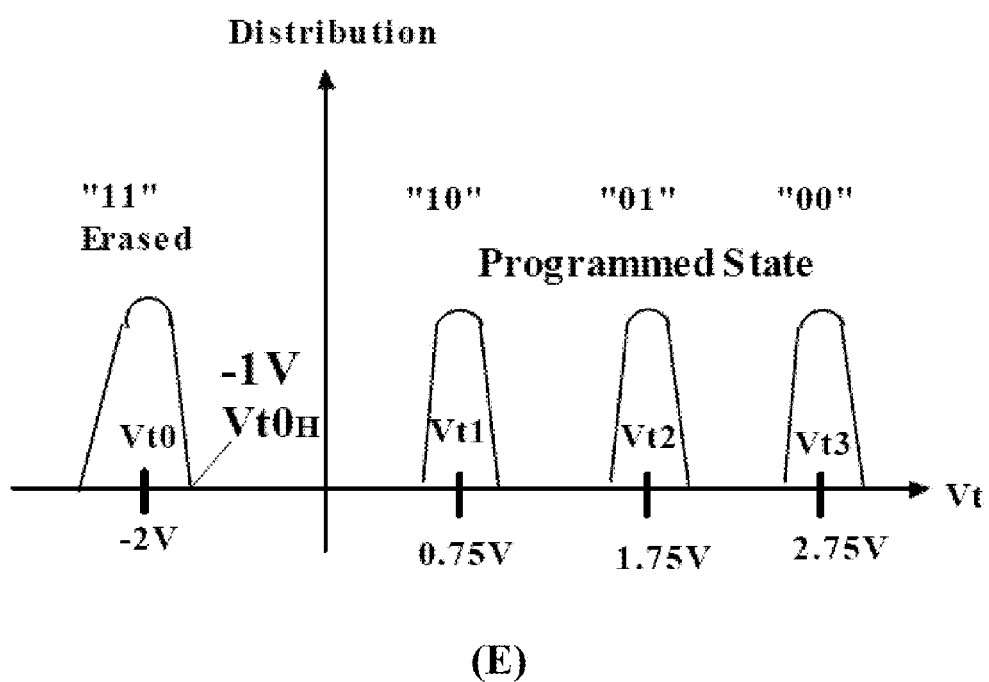
(E)
FIG. 1 (Continued, Prior Art)

| Symbol | Type | Description |
|---|---|---|
| A [N:0] | Input/Output | Address and Data input. Can also be used for data output during Read Status Register operation |
| DQ[15:0] | Input/Output | Data output |
| CE# | Input | Chip Enable |
| OE# | Input | Output Enable |
| WE# | Input | Write Enable |
| VCC | Supply | Device Power Supply |
| VCC | Supply | Versatile IO Input |
| VSS | Supply | Ground |
| RY/BY# | Output | Ready/Busy, Indicate whether an Embedded Algorithm is in progress or complete. At low, the device is actively erasing or programming. At high Z, the device is ready. |
| CLK | Input | Synchronize the device with the system's bus frequency in synchronous-read mode. |
| BYTE# | Input | Select data bus width. At low, the device is in byte configuration and data I/O pins DQ0~DQ7 are active. At high, the device is in word configuration and data I/O pins DQ0~DQ15 are active. |
| RESET | Input | Hardware reset. Low=device reset and return to reading array data. |
| WP#/ACC | Input | Write Protection Input. At low, disable program and erase functions in the outermost sector. At VHH, accelerates programming; automatically place device in unlock bypass mode. Should be at high for all other conditions. WP# has an internal pull-up; when unconnected, WP# is at high. |
| RFU1~n(n≥1) | Reserved | Reserved for future use |

FIG. 4

| Mode | A [N] | A [N-1:S] | A [S-1:0] | CE# | OE# | WE# | DQ [15:0] |
|---|---|---|---|---|---|---|---|
| Full Standby | X | X | X | H | X | X | HZ |
| Output Disable | X | X | X | X | H | X | HZ |
| Asynchronous NOR Read | 0 | B/W Address | B/W Address | L | L | H | Output Data |
| Asynchronous NAND Read | 1 | NAND_ID | Section Address | L | L | H | Output Data |
| Asynchronous SRAM Read | 1 | SRAM_ID | B/W Address | L | L | H | Output Data |
| Asynchronous SRAM Write | 1 | SRAM_ID | B/W Address | L | H | L | Write Data |
| Read NOR Status Register | 1 | NOR_SR_ID | NOR SR data | L | X | L | X |
| Read NAND Status Register | 1 | NAND_SR_ID | NAND SR data | L | X | L | X |

1. H=high, L=low, HZ=high-Z.
2. N, S are defined by the system maximum memory space area, N, S≥16.
3. NAND_ID, SRAM_ID, NOR_SR_ID, NAND_SR_ID are the specified values driven on the AD[N-1:S] to enable the NAND/NOR/SRAM in the system.
4. B/W Address: Byte/Word Address.
5. Section Address: the address of a section in the page. A section is 1/128 page or smaller.
6. NOR SR data is the NOR status register data, NAND SR data is the NAND status register data.

FIG. 5

| Command | 1st Bus Write Cycle | 2nd Bus Write Cycle | 3rd Bus Write Cycle | 4th Bus Write Cycle | 5th Bus Write Cycle | 6th Bus Write Cycle |
|---|---|---|---|---|---|---|
| NOR Erase | Code | Address Confirm code | | | | |
| NOR Program | Code | Address Data | N cycles Data (N>=1) | | | |
| NAND Erase | Code | Address1 | Address2 | Address3 | Address4 | Confirm Code |
| NAND Program | Code | Address1 | Address2 | Address3 | Address4 | N cycles Data (N>=1) |
| NAND B/W Read | Code | Address1 | Address2 | Address3 | Address4 | |
| NAND /NOR simultaneous read | Code | Address1 | Address2 | Address3 | Address4 | Confirm Code |

FIG. 6

| Operational Mode | Command Input | DQ[15:0] |
|---|---|---|
| Read NOR While NOR is Writing | NOR Read Command | Output NOR data |
| Read NOR While NAND is Writing | NOR Read Command | Output NOR data |
| Read NOR While NAND and NOR are Writing | NOR Read Command | Output NOR data |
| Read NOR While NAND is Reading | NOR Read Command | Switch from output NAND data to Output NOR data |
| Read NOR While SRAM is Reading | NOR Read Command | Switch from output SRAM data to Output NOR data |
| Read NOR While Others is Idle | NOR Read Command | Output NOR data |
| Write NOR While NOR is Reading | NOR Write Command | Output NOR data |
| Write NOR While NAND is Reading | NOR Write Command | Don't care |
| Write NOR While SRAM is Reading | NOR Write Command | Don't care |
| Write NOR While NAND is Writing | NOR Write Command | Don't care |
| Write NOR While Others is Idle | NOR Write Command | Don't care |
|  |  |  |
| Read NAND While NAND is Writing | NAND Read Command | Output NAND data |
| Read NAND While NOR is Writing | NAND Read Command | Output NAND data |
| Read NAND While NAND and NOR are Writing | NAND Read Command | Output NAND data |
| Read NAND While NOR is Reading | NAND Read Command | Switch from output NOR data to Output NAND data |
| Read NAND While SRAM is Reading | NAND Read Command | Switch from output SRAM data to Output NAND data |
| Read NAND While Others is Idle | NAND Read Command | Output NAND data |
| Write NAND While NAND is Reading | NAND Write Command | Output NAND data |
| Write NAND While NOR is Reading | NAND Write Command | Don't care |
| Write NAND While SRAM is Reading | NAND Write Command | Don't care |
| Write NAND While NOR is Writing | NAND Write Command | Don't care |
| Write NAND While Others is Idle | NAND Write Command | Don't care |
|  |  |  |
| Read SRAM While NAND is Writing | SRAM Read Command | Output SRAM data |
| Read SRAM While NOR is Writing | SRAM Read Command | Output SRAM data |
| Read SRAM While NAND and NOR are Writing | SRAM Read Command | Output SRAM data |
| Read SRAM While NOR is Reading | SRAM Read Command | Switch from output NOR data to Output SRAM data |
| Read SRAM While NAND is Reading | SRAM Read Command | Switch from output NAND data to Output SRAM data |
| Read SRAM While Others is Idle | SRAM Read Command | Output SRAM data |
| Write SRAM While NOR is Reading | SRAM Write Command | Don't care |
| Write SRAM While NAND is Reading | SRAM Write Command | Don't care |
| Write SRAM While NOR is Writing | SRAM Write Command | Don't care |
| Write SRAM While NAND is Writing | SRAM Write Command | Don't care |
| Write SRAM While NOR and NAND are Writing | SRAM Write Command | Don't care |
| Write SRAM While Others is Idle | SRAM Write Command | Don't care |

FIG. 7

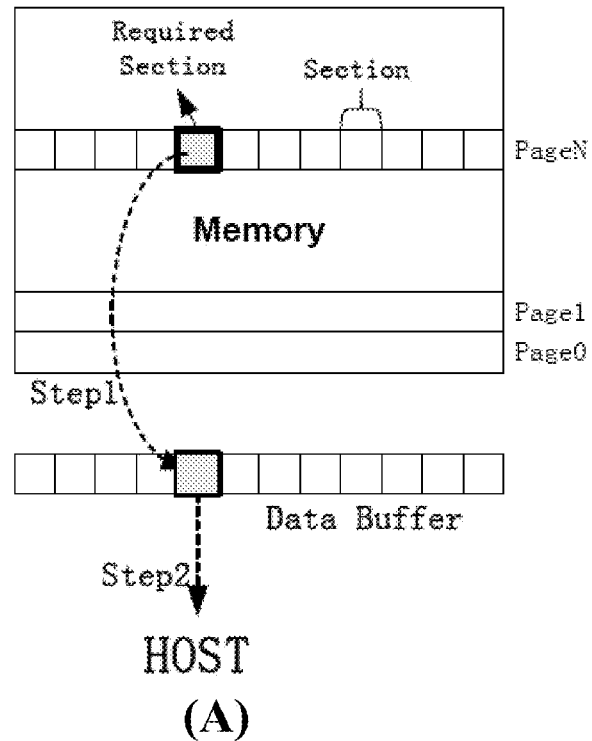
(A)
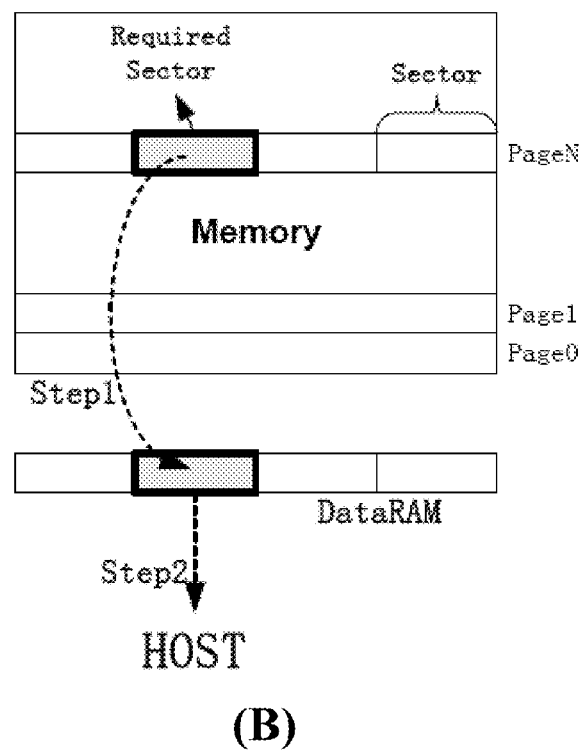
(B)
FIG. 8

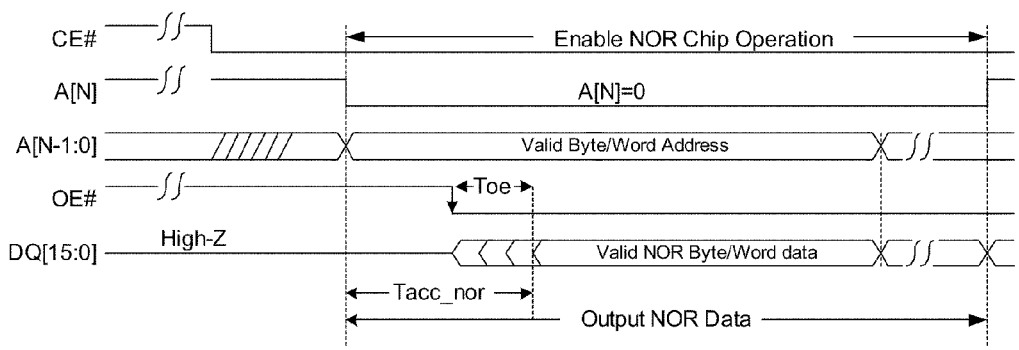
(A)
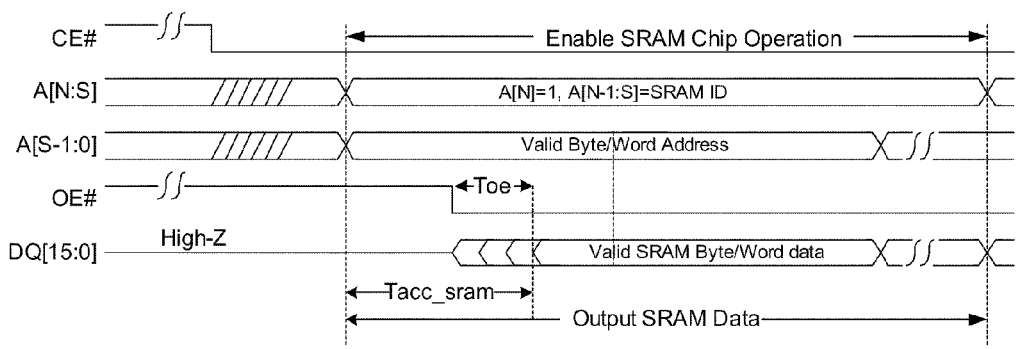
(B)
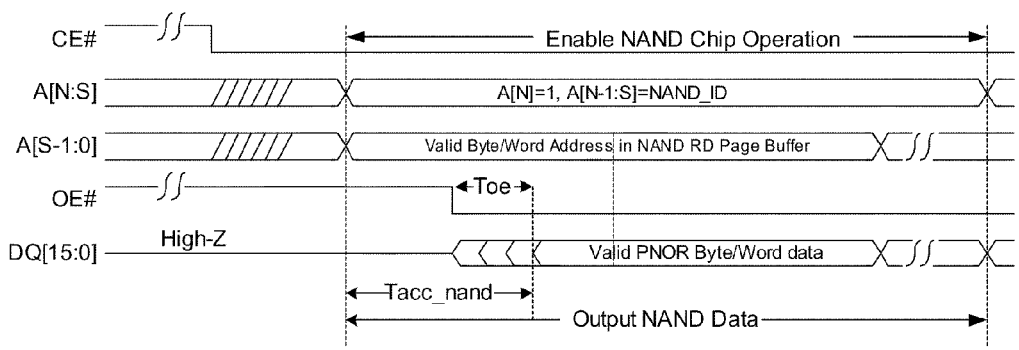
(C)
FIG. 9

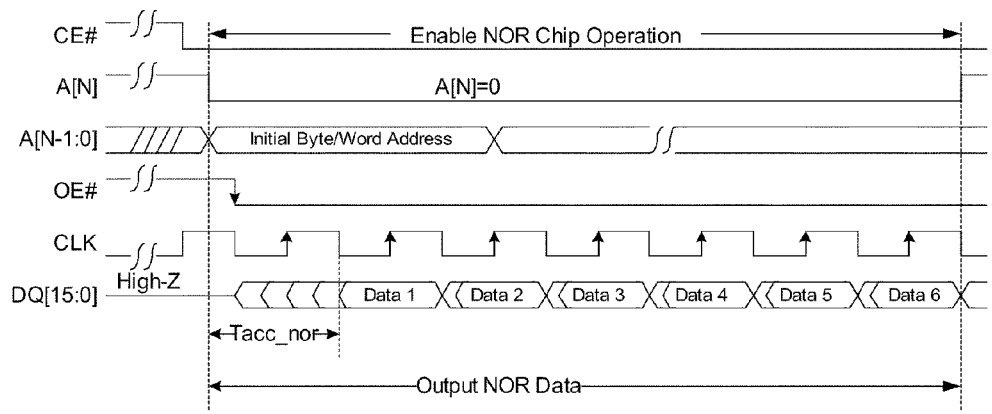
(D)
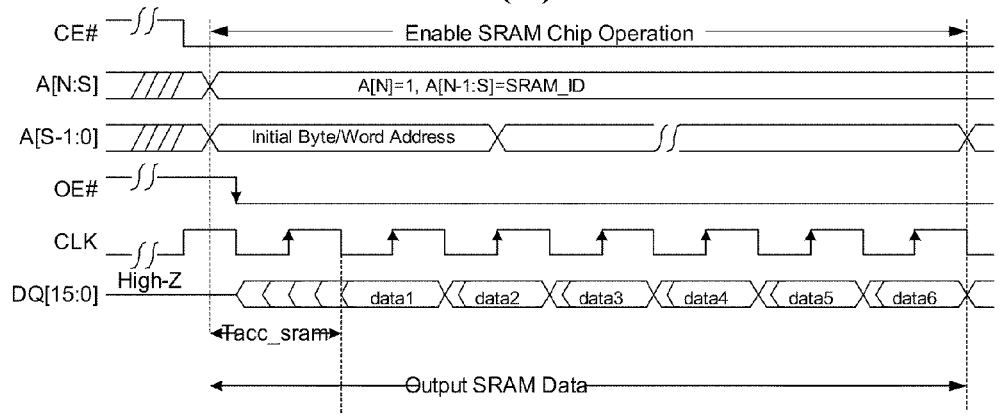
(E)
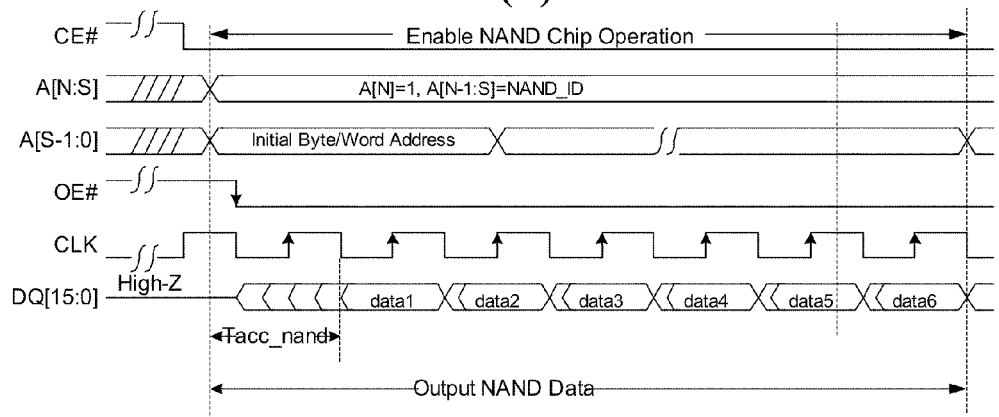
(F)
FIG. 9 (Continued)

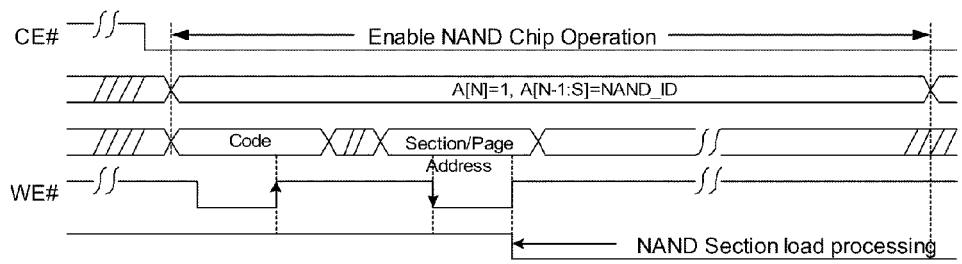
(G)
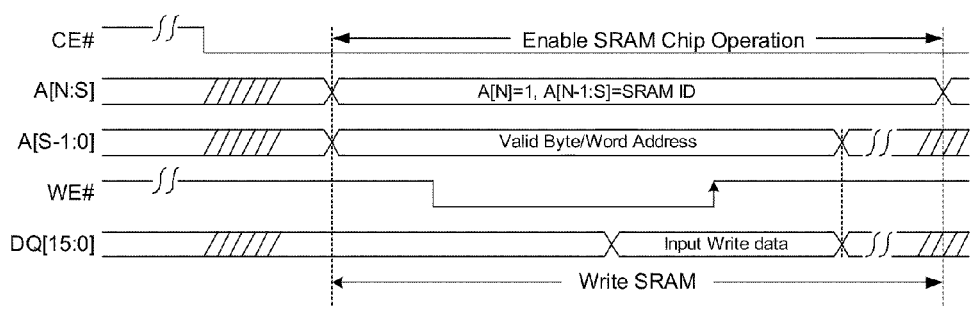
(H)
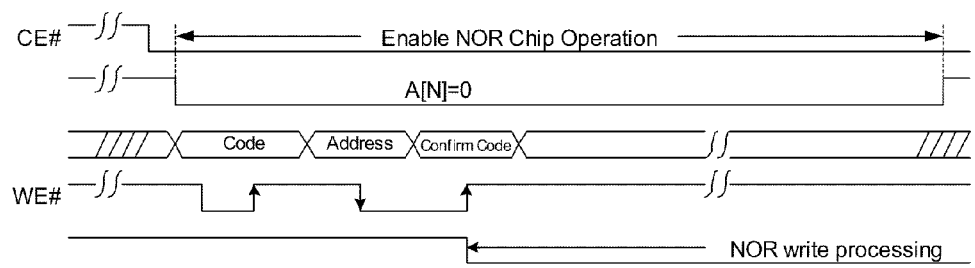
(I)
FIG. 9 (Continued)

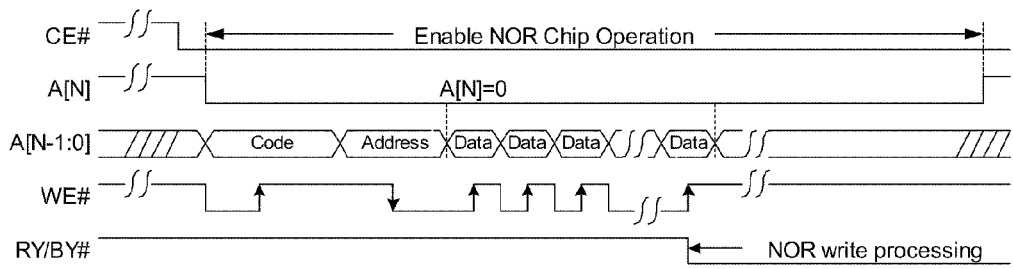
(J)
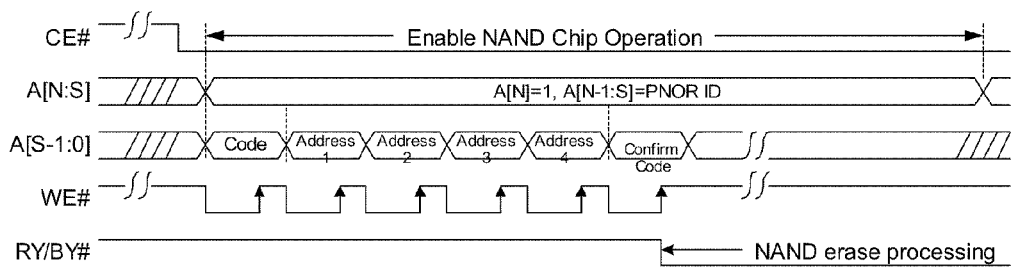
(K)
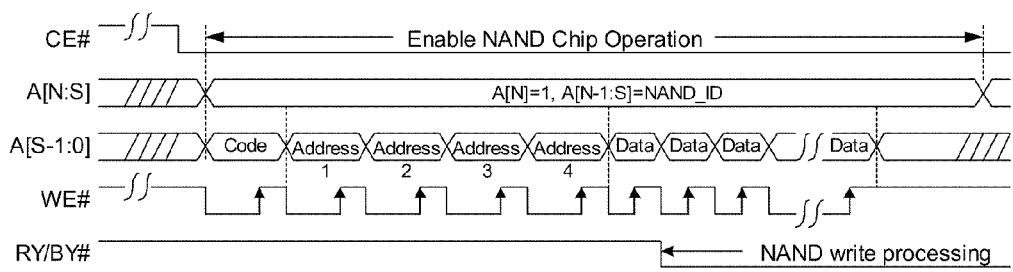
(L)
FIG. 9 (Continued)

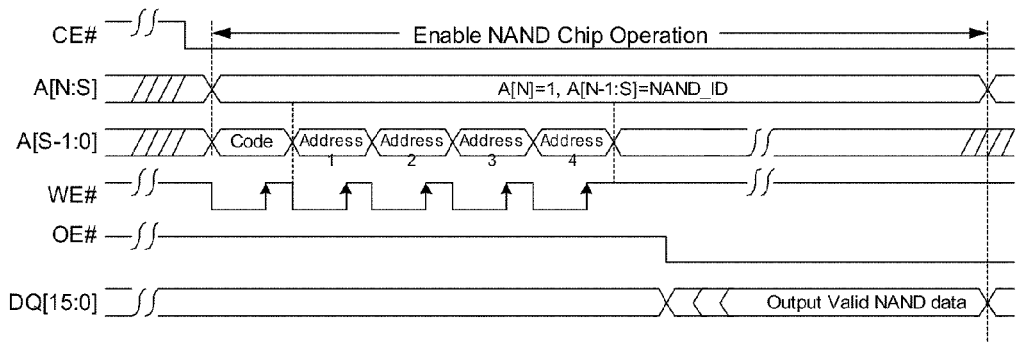
(M)
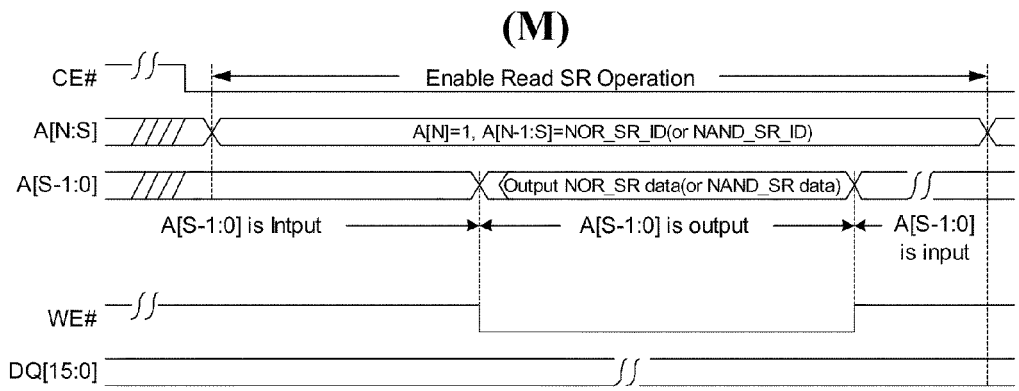
(N)
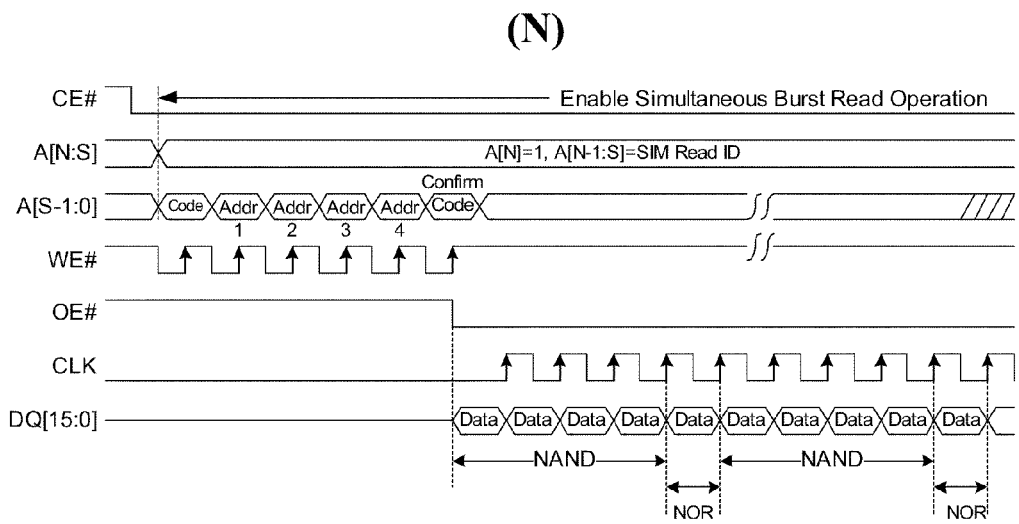
(O)
FIG. 9 (Continued)

(D)
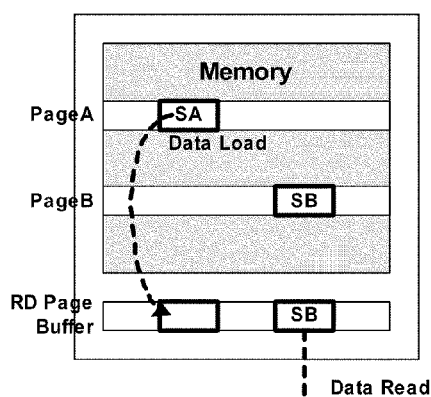
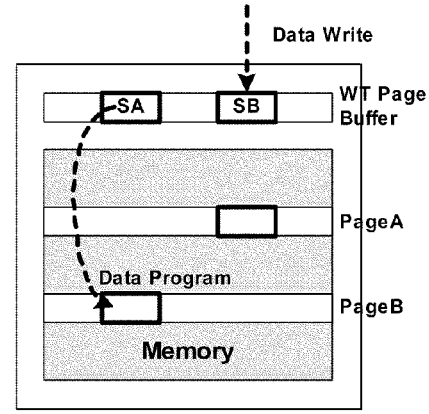
(E)
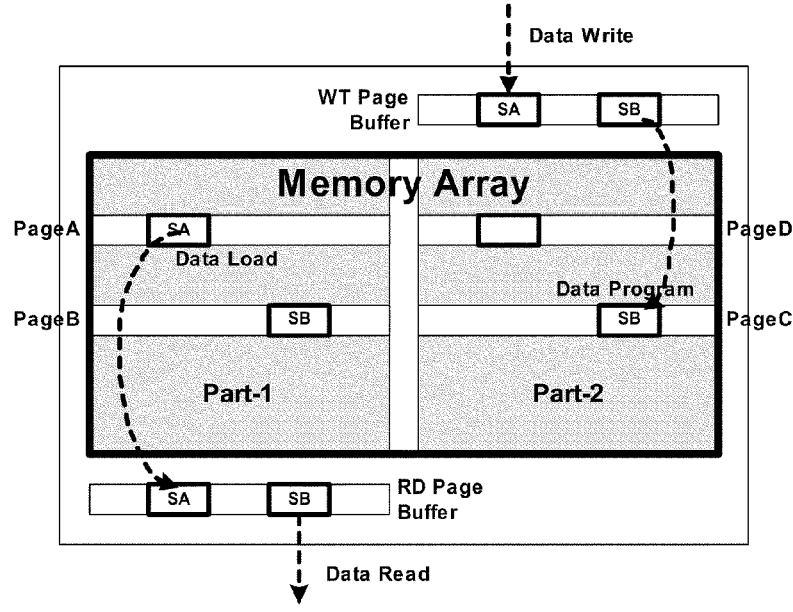
(F)
FIG. 10 (Continued)

MEMORY SYSTEM HAVING NAND-BASED NOR AND NAND FLASHES AND SRAM INTEGRATED IN ONE CHIP FOR HYBRID DATA, CODE AND CACHE STORAGE

This application claims the benefit of priority to U.S. Provisional Patent Application Ser. No. 61/269,894, filed Jun. 30, 2009, which is incorporated herein by reference in its entirety.

CROSS-REFERENCES TO RELATED APPLICATIONS

This application is related to U.S. patent application Ser. No. 12/387,771 filed on May 7, 2009 and Ser. No. 12/455, 337, filed on Jun. 1, 2009, assigned to the same assignee as the present invention, and incorporated herein by reference in the entirety.

FIELD OF THE INVENTION

The present invention generally relates to memory design that uses NAND flash cells and process to provide the flexibility of integrating two non-volatile memories (NVM) such as NAND flash cells and NOR flash cells and one volatile memory (VM) such as SRAM into one chip for hybrid code, data and cache storage.

BACKGROUND OF THE INVENTION

Nonvolatile memory is well known in the art. The different types of NVM include mask ROM, EPROM, EEPROM, NOR and NAND flash memories. In this invention, the terms NOR, NOR flash, and NOR memory are interchangeable used to generally refer to the NOR flash memories, and the same applies to the NAND flash memory. The VM includes DRAM and SRAM. DRAM cell has one transistor connected in series with one capacitor but SRAM cell is always comprised of a 6-transistor cell which is quite large in the silicon area used on a chip. In general, the cost of NAND memory is much cheaper than NOR memory and SRAM because a NAND cell has the smallest cell size with $4\lambda^2$ ($\lambda$ being a minimum feature size in a semiconductor process) for storing two single-level cell (SLC) binary data. The highest NAND memory density available today is 64 Gbs per chip with multi-level cell (MLC) storage by using 30 nm technology node. For a conventional ETOX™-based NOR cell, the cell size is about 12-16$\lambda^2$ and is becoming more and more difficult to be scaled down below 45 nm technology. The highest density of NOR flash is 1 Gbs using 32 nm process. The cell size of SRAM is always the largest one due to its 6-transistor cell with about 160$\lambda^2$ and therefore the highest density of SRAM is only around 64 Mb using 32 nm technology with about 7 to 8 metal layers.

FIG. 1A is a plane layout view of a conventional 1T 2-poly, floating-gate type NMOS NAND flash cell. Only three key cell's connection terminals of Drain (N-active), Source (N-active) and Gate (Poly2) are shown and denoted as "D", "S" and "G" respectively. A schematic symbol for the circuit corresponding to the NAND cell of FIG. 1A is shown in FIG. 1B. The circuit is a three-terminal, NMOS, 2-poly, floating-gate NAND cell. Three nodes for the drain, source and gate of the NAND cell are shown in the circuit. The other three nodes of the NAND cell include nodes for the triple P-well (TPW), deep N-well (DNW) and P-substrate (PSUB) are not shown in the schematic symbol.

FIG. 1C shows a cross sectional view of the NMOS NAND cell according to FIG. 1A. The floating-gate gate is made of a poly1 conduction layer right underneath a poly2-gate. The poly2-gate is denoted as "G." All six nodes (D, G, S, TPW, DNW and PSUB) of a single NAND cell have to be coupled with appropriate bias conditions in the circuit for respective operations. The poly1 node is a floating-node and therefore it has no external terminal for circuit connection. Poly1 is not accessible from the circuit.

FIG. 1D shows a chart of two typical wide Vt distributions of a conventional SLC NAND cell according to FIG. 1A. Two Vts include the first negative erased state of Vt0 with a center value of −2.0V and a variation of 2V, varying from −1.0V to −3.0V and the second positive programmed state of Vt1 with a center value of +2.0V and a variation of 2V, varying from +1.0V to +3.0V. A single physical NAND cell that stores 2-Vt is referred to as a 1b1T SLC NAND cell.

FIG. 1E shows another chart of four Vt distributions of a typical NAND cell according to FIG. 1A. Four Vts include the first negative erased state of Vt0 with a wide Vt distribution with a center value of −2.0V and a variation of 2V, varying from −1.0V to −3.0V, the second positive programmed state of Vt1 with a center value of +0.75V and a variation of 0.5V, varying from +0.5V to +1.0V, the third positive programmed state of Vt2 with a center value of +1.75V and a variation of 0.5V, varying from +1.5V to +2.0V and the fourth positive programmed state of Vt3 with a center value of +2.75V and a variation of 0.5V, varying from +2.5V to +3.0V. The three positive programmed states of Vt1, Vt2 and Vt3 are programmed states with a narrow distribution for a proper MLC operation. A NAND cell that stores four Vts is referred to as a 2b1T MLC NAND cell.

In recent years, usage and application of multiple types of NVM in one single-chip combo flash IC design are emerging in embedded CPU systems. A combo-type flash design that integrates NAND, NOR, EEPROM into one single-chip to save the board size, power consumption and overall system cost has found a big market in the semiconductor industry. Because NAND memory has the smallest cell size and most economical process, it is always desirable to use the NAND process to manufacture NOR and SRAM so that the highest integration of NVM and VM in one chip can be realized in a lowest manufacturing cost. However, in the conventional semiconductor technology, NAND, NOR and SRAM are not compatible in process and cannot be integrated into one chip.

SRAM memory can be made of low-voltage PMOS and NMOS devices in NAND or NOR process but it is not economical due to many high-voltage process steps involved in the conventional NOR and NAND. In practice, the real bottleneck to integrate the three different types of volatile and non-volatile memories in one chip is to integrate the two different types of non-volatile memories, i.e., NAND and NOR, in one chip. This is because NAND and NOR processes and cell operations are quite different in the conventional technology. If NAND and NOR can be fully integrated in one chip, then SRAM can always be integrated subsequently although the block size and speed performance of SRAM may not be best optimized.

Traditionally, the mainstream NAND and NOR cells are made of 2-poly floating-gate NMOS devices to store electrons for respective data and code storage. Both NAND and NOR cells are formed in a triple P-well within a deep N-well on top of a P-substrate. NOR cell operations such as erase and program are performed by using +/−10V. Therefore, the peripheral high voltage (HV) devices of NOR cells are tuned to sustain +/−10V drain breakdown voltage (BVDS). The peripheral process of NOR has triple P-wells for making HV NMOS to provide the negative high-voltage up to −10V. However, NAND cell operations use +20V without requiring any negative HV. As a result, the peripheral process of NAND does not need to have any triple P-well device for generating any negative HV. In summary, because of the very different HV requirements in cell operations described above, NAND and NOR processes are not made compatible at all.

In addition, during a program operation, the drain-to-source voltage (Vds) of a NOR cell has to be kept around +5.0V for channel hot electron injection (CHE) high current byte program. Due to this CHE scheme, the cell's channel length is very difficult to be scaled down below 65 nm. On the contrary, the program and erase operations of NAND cells require Vds=0V and the read operation requires Vds=1.0V. Therefore, the channel length of a NAND cell has been highly scaled down with a constant cell size of $4\lambda^2$ below 30 nm to manufacture a 64 Gb die with MLC storage.

There are several so-called combo flash designs in the market in recent years. Mainly, these combo-type NVM chips cover the integration of NAND and NOR with an objective of providing both code and data storages in one single flash memory device. In reality, however, neither true NAND nor true NOR has been realized due to the incompatible process of the conventional NAND and NOR flash memories.

The first kind of so-called combo NVM chips to store both data and code was introduced by Samsung's OneNAND™ flash. This chip design is not really a genuine combo type of NOR and NAND flashes. In fact, within an OneNAND™ chip, there exists only one type of NVM core memory, i.e., NAND, along with 16 KB SRAMs. There is no provision of true NOR memory inside the OneNAND™ chip. OneNAND™ achieves faster partial-random read than a regular NAND but is slower than a regular NOR. In short, Samsung OneNAND™ is a 1-die chip made of NAND and SARM along with a pseudo NOR interface. It is not a combo flash chip made of NAND and NOR. Its speed has been improved over the raw NAND but it is still slower than the real NOR. In addition, OneNAND™ is not a full random access NOR memory.

The second combo NVM chip that can store both data and code in one chip was proposed by Spansion in its old ORNAND™ scheme and new Eclipse™ flash architecture in 2008. Neither ORNAND™ nor Eclipse™ is a combo flash that integrates real NAND and NOR. In reality, the ORNAND™ architecture is disadvantageous because of the lack of an on-chip NAND memory to provide features of low bit-cost, fast and low-current write, and better cell scalability. Although Eclipse™ may use 4b1T (Quad-bit) to compete against MLC 2b1T NAND, its basic cell size is larger than NAND. It also requires an extra large overhead in array and peripheral area and has inferior P/E endurance cycles. In fact, ORNAND™ and Eclipse™ should not be referred to as a combo NVM chip design. It should be considered as a NOR flash memory for storing hybrid data.

A real combo NVM array architecture comprising NAND, NOR and EEPROM in one single IC chip using one unified 1T NAND flash process was first disclosed by the original NAND flash inventor, Toshiba. For example, the U.S. Pat. No. 7,333,766 of Toshiba discloses several combo NVM flash arrays integrating three NVMs of NAND, NOR and EEPROM in one chip. The basic idea of Toshiba's combo flash solution is to use a unified 1T NAND cell structure and process for building a 2T NOR array and a 3T or 4T EEPROM cell and array. The beauty of Toshiba's combo flash approaches is no need of any change in NAND process.

Like all other regular NAND flash memories available today, Toshiba's NAND is comprised of a plurality of NAND strings. Each NAND string has one top NMOS Select transistor, one bottom NMOS Select transistor and a string of 32 NAND cells sandwiched in between top and bottom Select transistors. These two Select transistors become a big overhead of a regular NAND string. It is because every 32 NAND cells need 2 Select transistors These two Select transistors require a high voltage and are un-scalable because of the need to sustain a bulk-erase voltage of 20V and a bit-line program inhibit voltage of 10V. The channel length of each Select transistor is almost 3 times of that of a NAND cell. In addition, these two Select transistors are physically formed near the top word line and bottom word line cells. Poly1 and Poly2 have to be shorted at appropriate array locations to make Select transistors as Poly-1 non-floating-gate devices. The process complexity and high risk of device breakdown in program and erase operations due to thin Poly-1 gate oxide thickness are the drawbacks of the traditional NAND sting.

In the 2T NOR cell proposed by Toshiba, each 2T NOR cell is comprised of two NMOS transistors and can only store 1-bit SLC data. It is referred to here as a 1b2T NOR cell in this description. The top transistor of this 2T NOR cell is a 1T floating-gate 2-poly NAND cell and the bottom transistor is a regular NMOS 1-poly Select transistor. Only the top 1T NAND cell has the capability to store code data. The bottom NMOS Select transistor acts as a device switch offering no storage usage. Therefore, the overhead of this 2T NOR cell is one Select transistor per NAND cell. In summary, each Toshiba's 2T NOR cell can store only 1-bit SLC (1b2T) data or 2-bit MLC (2b2T) data. Therefore, it has difficulty competing with Intel's 1b1T regular SLC NOR cell or 2b1T MLC Strataflash™ cell. Similarly, the 3T EEPROM cell proposed by Toshiba comprises one 2-poly floating-gate NAND cell with two 1-poly regular Select transistors. Therefore, the overhead is even higher than its 2T NOR cell.

In summary, the Toshiba's newly proposed combo flash architecture, i.e., 1T NAND, 2T NOR and 3T EEPROM, has the advantage that all three NVMs are using the same NAND process and the same 1T NAND cell structure. Therefore, NAND, NOR and EEPROM use the same erase and program schemes of Fowler-Nordheim (FN) tunneling. Thus, the design and process and unit cell structures are unified for this combo flash architecture. The Toshiba's solution is most suitable for Gb-density NAND, Mb-density (less than 128 Mb) NOR and low-density (greater than 1 Mb) EEPROM combo NVM applications.

SUMMARY OF THE INVENTION

The present is made to overcome the difficulty in integrating different types of NVM and VM into a single chip to manufacture a combined memory system. More particularly, this invention blends all the best attributes of NAND, NOR and SRAM into one chip design to provide the most powerful functions of NVM and VM in one chip. Accordingly, the extremely high-density fast random-access NOR memory, the extremely high density slow serial-read NAND memory are integrated and combined in a single chip by using a unified NAND cell and manufacturing process.

In accordance with the present invention, NAND and NAND-based NOR memories are manufactured on the same die and use the same FN-tunneling scheme to perform both fast page-program and fast block erase as the NAND memory. In addition, the slow serial read of high density conventional NOR memories has been improved to fast random read in unit of byte and word in the NAND-based NOR memory in the present invention.

In order to reduce the number of pins required for the combined memory chip, the present invention provides a method for the NAND, NOR and SRAM memories to share the same pins of the combined chip. The NOR pin definition with or without NAND memory and SRAM on the same chip is being kept fully compatible with the conventional NOR pin definition. The high-density NOR pins are used as a base for adding additional pins of NAND memory and SRAM to include pin definitions of NAND and SRAM into the existing pin definition of NOR memory.

In the combined chip of the present invention, the NAND memory, NOR memory and SRAM share the same input address bus and output data bus. By-directional input address bus in addition to conventional I/O pins is provided to achieve much faster and improved read and write operations of the memories. Bi-directional output data bus is controlled by one single output enable (OE) pin and one single chip enable (CE) pin to reduce the total pin count so as to fit in the existing NOR pin number.

In the present invention separate status registers for the respective NAND-based NOR and NAND memories on the same chip are provided to achieve more independent and faster operations. In addition, the invention provides separate ready/busy (RY/BY#) signals for the NOR and NAND memories inside the chip but an external RY/BY# pin is shared by both memories. A unique RY/BY# checking mechanism allows the host of the memory system to be informed when the first write operation is completed instead of all the write operations. This mechanism improves system response speed greatly. The host CPU issues an instruction to find out which memory has the external RY/BY# signal triggered due to the completion of a program or erase operation and then reset the signal if there is still other on-going program or erase operations in the memories.

Instead of using multiple OE and CE or chip select (CS) signals and pins to select different NAND and NOR memories, registers and other buffers, a novel memory-mapped method is provided to select the internal NOR, NAND, SRAM, status register of NOR, status register of NAND, page buffers of NOR and page buffers of NAND by using different addresses to reduce the number of external CE and OE pins required for the chip. A novel method is provided to input the code, data and address through the address input pins while I/O pins are dedicated for outputting the data.

In the present invention, a asynchronous status register command is used to read out the content of the status register from the address input A[S−1:0] without using data output DQ[15:0] and OE# for increasing the read speed. A synchronous read command for reading NAND and NOR memories simultaneously is provided to output the data of the NAND and NOR memories alternatively. Moreover, to achieve the compatibility for the NOR-based command set and the NAND-based command set for the memory system, NAND-based software commands are provided.

According to the invention, a dual part architecture for the NAND and NOR memories is provided to enable the memories to execute a Load/Read/Read-While-Load operation on one part of the memories during a simultaneous Program/Write/Write-While-Program operation on another part of the memories. Dual read (RD) page buffers and dual write (WT) page buffers are also provided for both NAND and NOR memories. A Read-While-Load operation with dual RD page buffers enables the execution of a data-read operation from one of the RD page buffers during a simultaneous data-load operation from the flash memories to the other RD page buffer to accelerate the read operation. Similarly, a Write-While-Program operation with dual WT page buffers enables the execution of a data-write operation to one of the WT page buffers during a simultaneous data-program operation to flash memories from the other WT page buffer to accelerate the program operation.

Furthermore, a Read-While-Load section operation with a single RD page buffer enables the execution of a data-read operation from one section of the RD page buffer during a simultaneous data-load operation from the flash memories to the other section of the RD page buffer. The operation accelerates the read operation and saves one RD page buffer. Similarly, a Write-While-Program section operation with a single WT page buffer enables the execution of a data-write operation to one section of the WT page buffer during a simultaneous data-program operation to the flash memories from the other section of the WT page buffer to accelerate the program operation and save one WT page buffer.

The foregoing and other features, aspects and advantages of the present invention will become better understood from a careful reading of a detailed description provided herein below with appropriate reference to the accompanying drawings.

BRIEF DESCRIPTION OF THE DRAWINGS

FIG. 1A is a plane layout view of a conventional 1T, 2-poly, floating-gate type NMOS NAND flash cell.

FIG. 1B is a schematic circuit symbol of the flash cell shown in FIG. 1A.

FIG. 1C is a cross sectional view of the NMOS NAND cell shown in FIG. 1A.

FIG. 1D is a chart of two typical wide Vt distributions of a conventional SLC NAND cell as shown in FIG. 1A.

FIG. 1E shows another chart of four Vt distributions of a conventional NAND cell as shown FIG. 1A.

FIG. 4 shows a table that lists the detail pin definition in the NOR-based interface of the memory system in the single chip according to the present invention.

FIG. 5 shows a table that lists the values specified for driving the input address bus to enable the NAND, NOR and SRAM memories of the memory system according to the present invention.

FIG. 6 shows a table of the software command cycles for various memory operations in the memory system according to the present invention.

FIG. 7 shows a table that lists a summary of the operational modes in the memory system according to the present invention.

FIG. 8A illustrates the read operation of a small section in the NAND memory of the memory system according to the present invention.

FIG. 8B illustrates a random byte/word read operation in the memory of Samsung OneNAND™.

FIG. 9A shows a timing diagram of the asynchronous NOR read operation in the present invention.

FIG. 9B shows a timing diagram of the asynchronous SRAM read operation in the present invention.

FIG. 9C shows a timing diagram of the asynchronous NAND read operation in the present invention.

FIG. 9D shows a timing diagram of the synchronous NOR read operation in the present invention.

FIG. 9E shows a timing diagram of the synchronous SRAM read operation in the present invention.

FIG. 9F shows a timing diagram of the synchronous NAND read operation in the present invention.

FIG. 9G shows a timing diagram of the NAND section load operation in the present invention.

FIG. 9H shows a timing diagram of the asynchronous SRAM write operation in the present invention.

FIG. 9I shows a timing diagram of the software command NOR erase operation in the present invention.

FIG. 9J shows a timing diagram of the software command NOR program program in the present invention.

FIG. 9K shows a timing diagram of the software command NAND erase operation in the present invention.

FIG. 9L shows a timing diagram of the software command NAND program operation in the present invention.

FIG. 9M shows a timing diagram of the software command NAND read operation in the present invention.

FIG. 9N shows a timing diagram of the asynchronous status register read protocol in the present invention.

FIG. 9O shows a timing diagram of the software command NAND/NOR simultaneously synchronous read operation in the present invention.

DETAILED DESCRIPTION OF THE PREFERRED EMBODIMENTS

Hereinafter, exemplary embodiments of the present invention will be described in detail. However, the present invention is not limited to the embodiments disclosed below, and can be implemented in various forms. The following embodiments are described in order to enable those of ordinary skill in the art to embody and practice the present invention.

Conventional NAND flash memories use Fowler-Nordheim (FN) tunneling scheme to perform block erase and page program operations. ETOX™-based NOR flash memories use FN to perform block erase operations and use channel hot electron (CHE) to perform program operations in unit of byte or word. Due to the inherent over-erase concern and the nature of high-power consumption of the CHE operation of ETOX™-based NOR flash memories, the program speed of the conventional NOR flash memory is 50 times slower than the NAND counterpart in page program operations. Similarly, the erase speed of the NOR flash memory is 500 times slower than that of NAND flash memory.

Because NAND cells and process have the advantages of the smallest size and lowest cost, the present invention provides a new method to manufacture high-density NOR memories based on NAND cells and process instead of the non-scalable NOR ETOX™ process. The present invention provides a NOR flash memory based on a NAND-based NOR cell formed by a symmetrical 2-NAND cell string and uses NAND FN-tunneling for both erase and program operations. The long-held over-erase concern is completely eliminated from this NAND-based NOR memory. As a result, the integration of NAND, NOR and SRAM memories according to the present invention achieves the best performance in terms of cost, speed and density. The equivalent circuits of the NOR cell of the NAND-based NOR memory, the NAND cell string of the NAND memory, and the SRAM cell of the SRAM memory of the present invention are shown in FIGS. 2A, 2B and 2C respectively.

Figure 2:
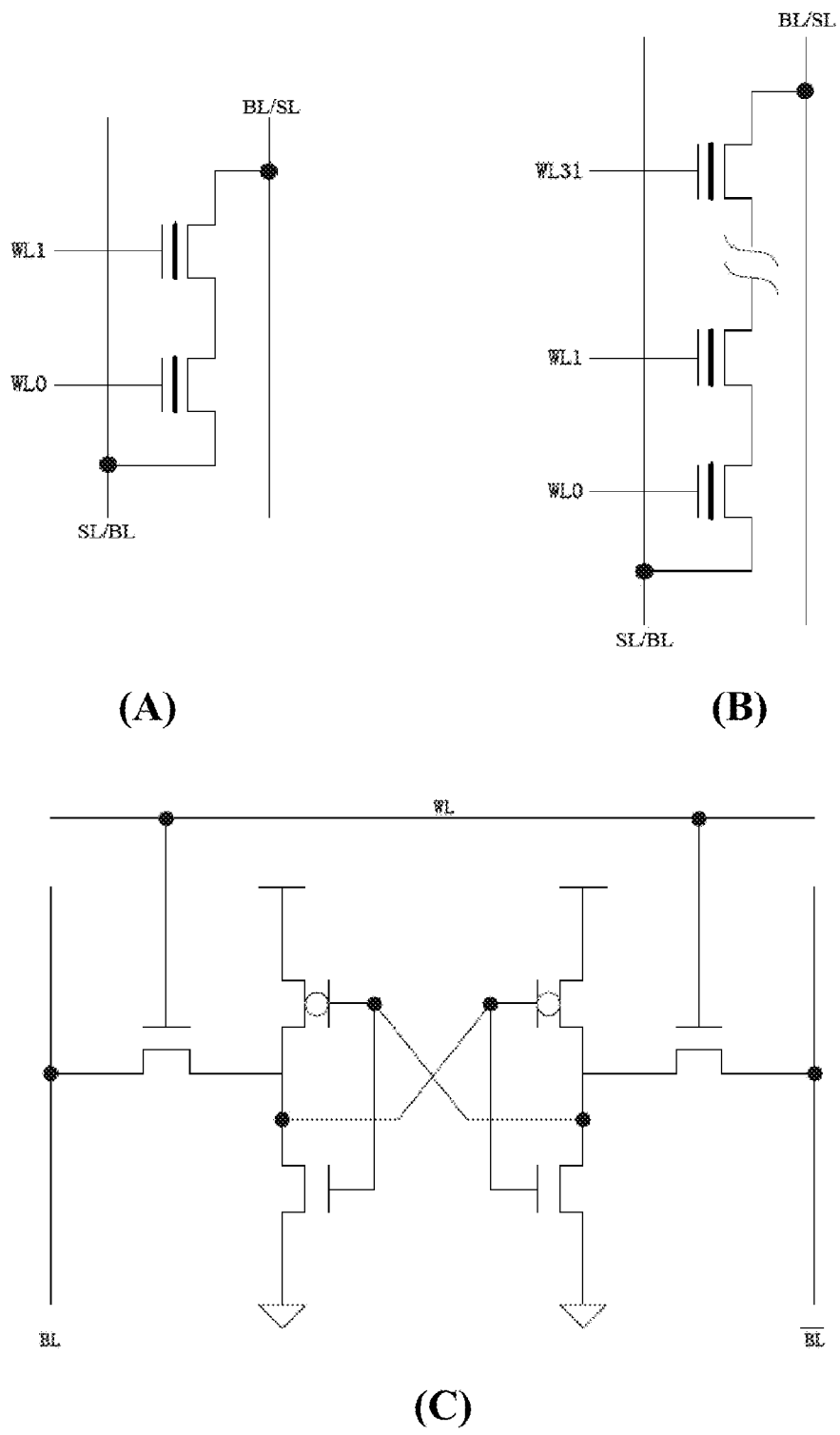
FIG. 2A shows an equivalent circuit of a NOR cell of the NAND-based NOR memory in the present invention.
FIG. 2B shows an equivalent circuit of a NAND cell of the NAND memory in the present invention.
FIG. 2C shows an equivalent circuit of a SRAM cell of the SRAM memory in the present invention.

It is worth noting that the NAND-based NOR cell as shown in FIG. 2A has a unique structure different from NOR cells in the prior art. The NOR cell has dual floating gate transistors to provide two symmetrical bits of a NOR cell for two bit storage. Each NOR cell has a drain and a source connected to a metal bit line (BL) and a metal source line (SL) respectively. As discussed in previous sections, the conventional NAND-based 2T NOR cell requires a Select transistor connected serially on the bottom with the flash cell. Therefore, it is economical only for small-density embedded MCU (microcontroller unit) applications. The other conventional 1T ETOX™-based NOR cell does not comprise a Select transistor but has the long-held over-erasure concern. Both types of conventional NOR cells have one common disadvantage of not being scalable below 65 nm. However, the NAND-based NOR cell of the invention does not have any serially connected select device.

As shown in FIG. 2A, the source line and bit line of the NAND-based NOR cell are running in parallel and perpendicular to the word line. As can be seen from FIG. 2B, the bit line and source line of the NAND cell string in the NAND memory are also running in parallel and perpendicular to the word line. In the present invention, both NOR string and NAND string have bit line and source line running in a preferable Y-direction which is perpendicular to all word lines running in a preferable X-direction.

Accordingly, NAND and NOR memories of the present invention become fully compatible in process, and therefore the two types of NVM can be integrated into one chip for code and data storage with true cost effectiveness. Once NAND and NOR memories are integrated, SRAM can also be integrated with NAND and NOR memories in a single chip. As a result, the design flexibility of integrating any combination of NAND, NOR and SRAM memories into one chip also becomes feasible. For example, any two of the NAND, NOR and SRAM memories can be integrated in a single chip.

In the case of three memories being integrated into one, the pin number has to be large enough to cover the pin requirement of the three memories. In general, the NOR flash memory has the highest pin count due to the specification defined for random access code reading in unit of byte or word. Typically, NAND memory has higher density than NOR memory and SRAM but the read specification of NAND is defined in unit of page of 512-byte or 2K-byte and data are read serially and slowly. For example, 1 Gb NOR memory has 58-pins but a high-density NAND memory has about 48 pins only. Because the highest density SRAM is only 64 Mb, the number of address pins is much smaller than NOR.

In order to reduce the number of pins required for the combined memory chip, the present invention provides a method for the NAND, NOR and SRAM memories to share the same pins of the combined chip. The high-density NOR pin definition is used as a base for adding additional NAND and SRAM pin functions. In other words, the present invention adds the pin definitions of the NAND memory and SRAM into the existing pin definition of the NOR memory. The NOR pin definition with or without the NAND memory and SRAM on the same chip is being kept fully compatible with the conventional NOR pin definition.

Figure 3:
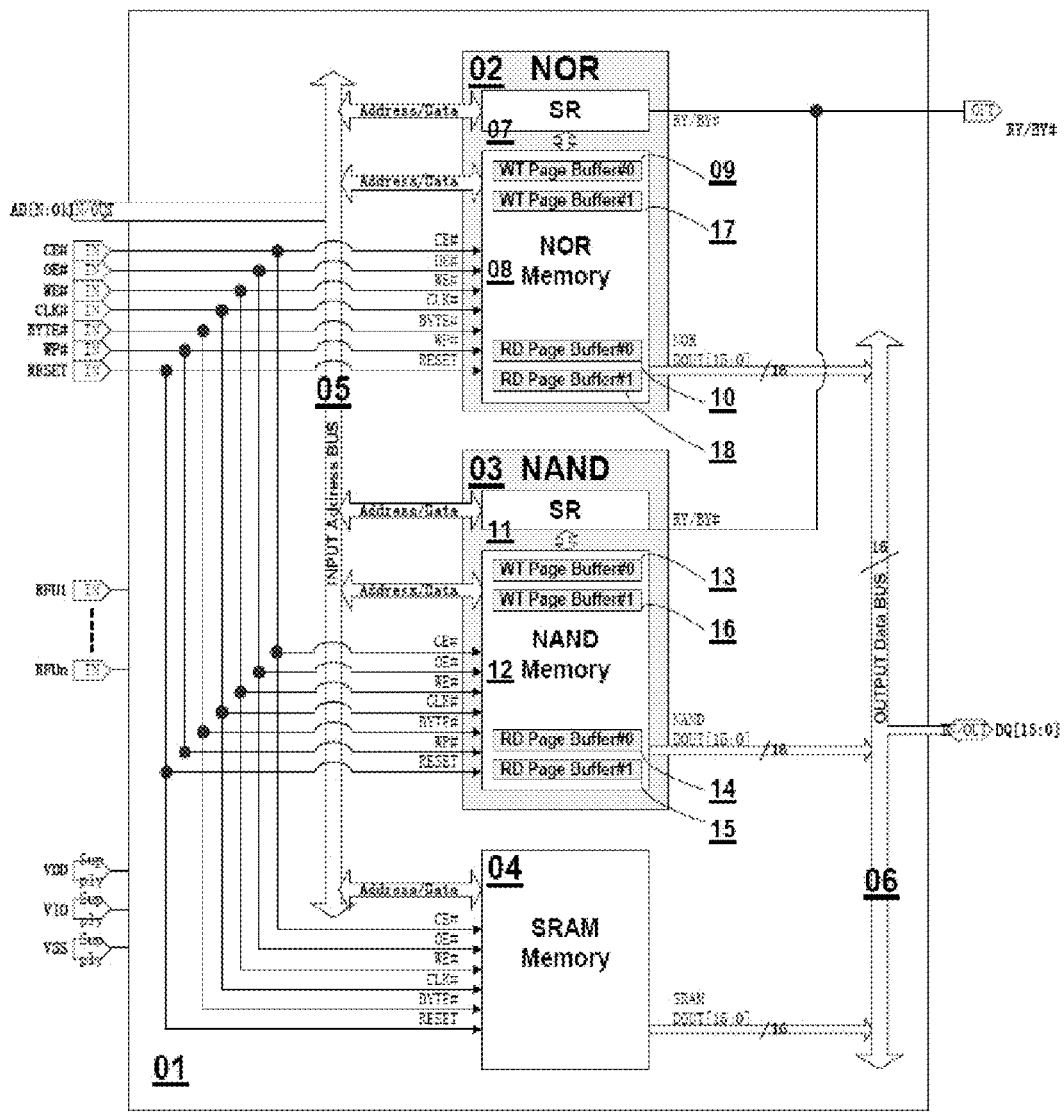
FIG. 3 shows a block diagram of a highly integrated memory system on a chip according to the present invention.

FIG. 3 shows a block diagram of a memory system 01 on a chip that provides a highly integrated memory solution according to the present invention. The memory system 01 includes at least a NOR flash memory unit 02, a NAND flash memory unit 03, and an SRAM memory unit 04. A bi-directional input address bus 05 and a bi-directional output data bus 06 in the memory system 01 are shared by the NAND, NOR and SRAM memory units of the system.

According to present invention, extremely high density fast random-access NOR memory, extremely high density slow serial-read NAND memory and fast random-access SRAM are combined on one chip by using a unified NAND manufacturing process and NAND cells. All three memories share the same pins of the combined chip. NAND and NOR memories are on the same chip and use the same FN-tunneling scheme to perform fast page program, fast page erase and fast block erase operations as the conventional NAND memory. However, the speed of the NAND-based NOR memory of the present invention has been improved from the conventional slow serial read to fast random read in unit of byte and word.

The three-on-one chip of the present invention may be treated by the host as three independent memory chips such as an independent NOR memory chip, an independent NAND memory chip and an independent SRAM chip but all sharing the same pins determined by the NOR memory. The high density NAND-based NOR memory in the system can reach NxGbits, depending on the selected manufacturing process node. Ideally, this NAND-based NOR memory density can be as high as one half of the NAND memory density manufactured in the same technology node. For example, using 32 nm technology node, a 64 Gb NAND memory in one chip can be manufactured. The same 32 nm technology node can manufacture the NAND-based NOR memory with a density of 32 Gbs in accordance with the present invention.

It is preferred to have the input address bus and the output data bus shared by all the NOR, NAND and SRAM memories within the combined chip in the system of the present invention. The bi-directional input address bus is provided for the NAND, NOR and SRAM memories in addition to the regular I/O pins defined by the conventional memories. In this way, the operations of the three memories can be much improved for faster read and write. In contrast to the known prior art, the bi-directional output data bus shared by the NAND, NOR and SRAM memories is controlled by one single OE pin and one single CE pin in the present invention to reduce the total pin count so as to fit in the existing NOR memory pin numbers.

The NOR memory unit 02 includes a NOR memory 08 and a status register (SR) 07. The NOR memory 08 includes dual write page buffers, WT page buffer#0 09 and WT page buffer#1 17, and dual read page buffers, RD page buffer#0 10 and RD page buffer#1 18. The NAND memory unit 03 includes a NAND memory 12 and a status register (SR) 11. The NAND memory 12 also includes dual write page buffers, WT page buffer#0 13 and WT page buffer#1 16, and dual read page buffers, RD page buffer#0 14 and RD page buffer#1 15.

As shown in FIG. 3, separate status registers are provided for the NAND-based NOR memory and the NAND memory respectively on the same chip to achieve more independent and faster operations. The NOR and NAND memories inside the chip have their own separate RY/BY# signals but the external RY/BY# pin is shared by both NAND and NOR memories. The host CPU issues an instruction to find out which memory that has completed a program or erase operation triggers the external RY/BY# signal and then reset the signal if there is still another on going program or erase operation in the NAND or NOR memory.

In order to reduce the external pin count of CE and OE pins, the present invention provides a novel method to select the memory-mapped internal NOR, NAND, SRAM, NOR status register, NAND status register, NOR page buffers and NAND page buffers by using different addresses with the same CE and OE pins instead of using separate chip enable signals. Furthermore, a method to input code, data and address through the address input pins is provided while I/O pins are dedicated to outputting the data.

In the present invention, an asynchronous status register read command is provided to read the content of a status register from the input address bus A[S−1:0] without using the output data bus DQ[15:0] and OE# for increasing the read speed. A synchronous read command to read NAND and NOR memories simultaneously is provided. The synchronous read command outputs the data in the NAND and NOR memories through the output data bus alternatively. The NAND-based software commands used in the invention enable the system to have compatibility for the NOR-based command set and the NAND-based command set.

The present invention provides a NOR-based interface that makes the system capable of interfacing directly with a CPU that has an existing NOR-interface. FIG. 4 is a table for the detail pin definition in the NOR-based interface. The NAND, NOR and SRAM memories of the system are enabled by driving the input address bus with the specified values listed in the table shown in FIG. 5. The operations of the system are initiated by writing specific commands or a sequence with specific address and data patterns into the command interface. FIG. 6 is a table showing the software command cycles for various memory operations in the memory system, and FIG. 7 is a table for a summary of the operational modes in the memory system.

According to the present invention, the NAND memory has more address inputs and can locate a smaller section in a page, such as 1/128 page or smaller. In a read operation of the present invention, the NAND memory only needs to load the content of a section to the RD page buffer in the first step and the host can read the required byte/word from the specified section in the second step. FIG. 8A illustrates the read operation according to the present invention. Similarly, a small section in the NAND memory can also be accessed for a write operation. Compared to Samsung OneNAND™, the section operation of the present invention provides the advantages of more flexibility and power saving. For example, as illustrated in FIG. 8B, in a OneNAND™ random Byte/Word operation, the OneNAND™ needs to load at least the content of a sector (¼ page) or more from the memory to the dataRAM in the first step, and then the host can read the required Byte/Word from the dataRAM in the second step.

FIG. 9A shows the signal waveforms and timing for the asynchronous NOR read operation in the memory system according to the present invention. This operation reads a random Byte or Word from the NOR memory asynchronously. The definition of each signal shown in the figure can be found in FIG. 4. The host must first drive A[N] to low and assert a valid Byte or Word address on A[N−1:0] while driving OE# and CE# to low. WE#, which is not shown in the figure, must remain at high. CLK is not used for the asynchronous read mode and is ignored. The OE# signal must be driven to low. Data will appear on DQ[15:0] after the address access time Tacc_nor, which is equal to the delay from the time when the address is stable to the time when output data are valid. Data are available on DQ[15:0] pins after the access time Toe has elapsed from the trailing edge of OE# assuming that the access time Tacc_nor has been met.

FIG. 9B shows the signal waveforms and timing for the asynchronous SRAM read operation in the memory system according to the present invention. This operation reads a random Byte or Word from the SRAM memory asynchronously. The host must first drive A[N] to high and assert a valid SRAM_ID value on A[N-1:S]. The host must also drive a valid Byte or Word address on A[S-1:0] while driving OE# and CE# to low. WE#, which is not shown, must remain at high. CLK is not used for the asynchronous read mode and is ignored. Data will appear on DQ[15:0] after the address access time Tacc_sram, which is equal to the delay from the time when the address is stable to the time when output data are valid. The OE# signal must be driven to low. Data are available on DQ[15:0] pins after the access time Toe has elapsed from the trailing edge of OE# assuming that the access time Tacc_sram has been met.

FIG. 9C shows the signal waveforms and timing for the asynchronous NAND read operation in the memory system according to the present invention. This operation reads a random Byte or Word from the NAND memory RD page buffer asynchronously. The host must first drive A[N] to high and assert a valid NAND_ID value on A[N-1:S]. The host must also drive a valid Byte or Word address on A[S-1:0] while driving OE# and CE# to low. WE#, which is not shown, must remain at high. CLK is not used for the asynchronous read mode and is ignored. Data will appear on DQ[15:0] after address access time Tacc_nand, which is equal to the delay from the time when the address is stable to the time when output data are valid. The OE# signal must be driven to low. Data are available on DQ[15:0] pins after the access time Toe has elapsed from the trailing edge of OE# assuming that the access time Tacc_nand has been met.

FIG. 9D shows the signal waveforms and timing for the synchronous NOR read operation in the memory system according to the present invention. This operation reads a random Byte or Word from the NOR memory synchronously. The host must first drive A[N] to low and assert an initial address on A[N-1:0] while driving OE# and CE# to low. WE#, which is not shown, must remain at high. Once OE# is asserted, the first Byte or Word is driven onto DQ[15:0] on the next valid CLK edge after initial access latency delay Tacc_nor. Subsequent data are available on valid CLK edges following a minimum delay Tchqv.

FIG. 9E shows the signal waveforms and timing for the synchronous SRAM read operation in the memory system according to the present invention. To perform an SRAM synchronous read, the host must first drive A[N] to high and assert a valid SRAM_ID value on A[N-1:S]. The host must also drive an initial address on A[S-1:0] while driving OE# and CE# to low. WE#, which is not shown, must remain at high. Once OE# is asserted, the first Byte or Word is driven onto DQ[15:0] on the next valid CLK edge after initial access latency delay Tacc_sram. Subsequent data are available on valid CLK edges following a minimum delay Tchqv.

FIG. 9F shows the signal waveforms and timing for the synchronous NAND read operation in the memory system according to the present invention. This operation reads out the NAND memory RD page buffer content synchronously. To perform a NAND synchronous read, the host must first drive A[N] to high, assert a valid NAND_ID value on A[N-1:S] and a valid page address on A[S-1:0] while driving OE# and CE# to low. WE#, which is not shown, must remain at high. Once OE# is asserted, the first Byte or Word of the RD page buffer is driven onto DQ[15:0] on the next valid CLK edge after initial access latency delay Tacc_nand. Subsequent data are available on valid CLK edges following a minimum delay Tchqv.

FIG. 9G shows the signal waveforms and timing for the NAND load operation in the memory system according to the present invention. This operation loads a section or a page from the NAND memory to its RD page buffer. The host must first drive A[N] to high and assert a valid NAND_ID value on A[N-1:S]. Two bus write cycles are used to issue this command. The code is inputted through A[S-1:0] in the first bus write cycle and is decoded to distinguish the operations between section load and page load. The section or page address is inputted through A[S-1:0] in the second bus write cycle. The address will be latched by the falling edge of WE#. The load operation is controlled by an embedded load algorithm. RY/BY# will go low during the load process and will return to high when the load operation is completed. The host can determine the status of the load operation by checking the status register of the NAND memory. When the embedded load algorithm is completed, the device then returns to the read mode.

FIG. 9H shows the signal waveforms and timing for the asynchronous SRAM write operation in the memory system according to the present invention. This operation writes the SRAM memory asynchronously. The host must first drive A[N] to high and assert a valid SRAM_ID value on A[N-1:S]. The host must also drive a valid address on A[S-1:0] while driving WE# and CE# to low. OE#, which is not shown, must remain at high. The input data on DQ[15:0] must be valid for time Tdset before WE# goes high and must be kept stable for time Tdhold after the rising edge of WE#.

FIG. 9I shows the signal waveforms and timing for the software command NOR erase operation in the memory system according to the present invention. This operation erases the NOR memory by sending a software command. The host must first drive A[N] to low. Two bus write cycles are used to issue this command. The code is inputted through A[N-1:0] in the first bus write cycle and is decoded to determine the type of operation, such as page erase, sector erase, chip erase, . . . etc. The address and confirm code are inputted through A[N-1:0] in the second bus write cycle. The address will be latched by the falling edge of WE# and the confirm code will be latched by the rising edge of WE#. The erase operation is controlled by an embedded program or erase algorithm. RY/BY# will go low during the erase process and will return to high when the erase operation is completed. The host can determine the status of the erase operation by checking the status register of the NOR memory. When the embedded program or erase algorithm is completed, the device then returns to the read mode.

FIG. 9J shows the signal waveforms and timing for the software command NOR program operation in the memory system according to the present invention. This operation programs the NOR memory by sending a software command. The host must first drive A[N] to low. Two bus write cycles are used to issue this command. The code is inputted through A[N-1:0] in the first bus write cycle and is decoded to determine the type of operation, such as page program, byte program, . . . , etc. The address and data are inputted through A[N-1:0] in the second bus write cycle. The address will be latched by the falling edge of WE# and the data will be latched by the rising edge of WE#. For page program operation, N−1 (N is an integer number defined by the page size) bus write cycles will be followed to load one page data into the WT page buffer of the NOR memory. The program operation is controlled by an embedded program or erase algorithm. RY/BY# will go low during the program process and will return to high when the program operation is completed. The host can determine the status of the program operation by checking the status register of the NOR memory. When the embedded program or erase algorithm is completed, the device then returns to the read mode.

FIG. 9K shows the signal waveforms and timing for the software command NAND erase operation in the memory system according to the present invention. This operation erases the NAND memory by sending a software command. The host must first drive A[N] to high and assert a valid NAND_ID value on A[N-1:S]. Six bus write cycles are used to issue the command. The code is sent through A[S-1:0] in the first bus write cycle and is decoded to determine the type of operation, such as page erase, sector erase, chip erase, . . . , etc. The address is sent through A[S-1:0] in the subsequent four bus write cycles. The confirm code is sent through A[S-1:0] in the sixth bus write cycle. The address will be latched by the rising edge of WE# and the data will be latched by the rising edge of WE#. The erase operation is controlled by an embedded program or erase algorithm. RY/BY# will go low during the erase process and will return to high when the erase operation is completed. The host can determine the status of the erase operation by checking the status register of the NAND memory. When the embedded program or erase algorithm is completed, the device then returns to the read mode.

FIG. 9L shows the signal waveforms and timing for the software command NAND program operation in the memory system according to the present invention. This operation programs the NAND memory by sending a software command. The host must first drive A[N] to high and assert a valid NAND_ID value on A[N-1:S]. Six bus write cycles are used to issue the command. The code is inputted through A[S–1:0] in the first bus write cycle and is decoded to determine the type of operation, such as page program, byte program, . . . , etc. The address is inputted through A[S-1:0] in the subsequent four bus write cycles. The data are inputted in the sixth bus write cycle. The address will be latched by the rising edge of WE# and the data will be latched by the rising edge of WE#. For page program operation, N–1 (N is an integer defined by the page size) bus write cycles will be followed to load one page data into the WT page buffer of the NAND memory. The program operation is controlled by an embedded program or erase algorithm. RY/BY# will go low during the program process and will return to high when the program operation is completed. The host can determine the status of the program operation by checking the status register of the NAND memory. When the embedded program or erase algorithm is completed, the device then returns to the read mode.

FIG. 9M shows the signal waveforms and timing for the software command NAND read operation in the memory system according to the present invention. This operation reads out a random Byte or Word from the NAND memory without loading NAND section operation. Five bus write cycles are used to issue this command. The host must first drive A[N] to high and assert a valid NAND_ID value on A[N-1:S]. The code is inputted through A[S-1:0] in the first bus write cycle. The address is inputted through A[S-1:0] in the subsequent four bus write cycles. The address will be latched by the rising edge of WE#. Once OE# is asserted, data will appear on DQ[15:0] after address access time Tacc_nand, which is equal to the delay from the time when the address is stable to the time when the output data are valid. Data are available on DQ[15:0] pins after the access time Toe has elapsed from the trailing edge of OE# assuming that the access time Tacc has been met.

FIG. 9N shows the signal waveforms and timing for the status register read operation in the memory system according to the present invention. The operation reads out the content of the status register in the NOR or NAND memory through A[S-1:0]. The host must first drive A[N] to high and assert a valid NOR_SR_ID value for the NOR status register or a valid NAND_SR_ID value for the NAND status register on A[N-1:S] while driving WE# and CE# to low. The OE# can be kept high or low. Once WE# is asserted, the content of the NOR or NAND status register is driven onto A[S-1:0] during the valid period of WE# and A[S-1:0] acts as the output. Once WE# is de-asserted, A[S-1:0] acts as input. This operation does not use DQ[15:0] or OE# and they are available for other applications.

FIG. 9O shows the signal waveforms and timing for the software command NAND/NOR simultaneously synchronous read operation in the memory system according to the present invention. This operation reads out the NOR memory and the content of the RD page buffer of the NAND memory synchronously. Six bus write cycles are used to issue the command. The host must first drive A[N] to high and assert a valid SIM_READ_ID value on A[N-1:S]. The code is inputted through A[S-1:0] in the first bus write cycle. The address is inputted through A[S-1:0] in the subsequent four bus write cycles. The confirm code is inputted through A[S-1:0] in the sixth bus write cycle. The address will be latched by the rising edge of WE# and the confirm code will also be latched by the rising edge of WE#. Once OE# is asserted, the first NAND data are driven onto DQ[15:0] on the next valid CLK edge after initial access latency delay. The NOR data will be driven onto DQ[15:0] every four valid CLK edges. Subsequent data are available on valid CLK edges following a minimum delay Tchqv.

In the present invention, the performance of read and write is improved by allowing simultaneous data-read and data-load operations and simultaneous data-write and data-program operations respectively. As shown in FIG. 3, the dual RD page buffers in both NAND and NOR memories enable the execution of a data-read operation from one of the RD page buffers during a simultaneous data-load operation from the flash memory to the other RD page buffer. This operation accelerates the read operation speed. Similarly, the dual WT page buffers in both NAND and NOR memories enable the execution of a data-write operation to one of the WT page buffers during a simultaneous data-program operation to the flash memory from the other WT page buffer. This operation accelerates the program operation speed.

Figure 10:
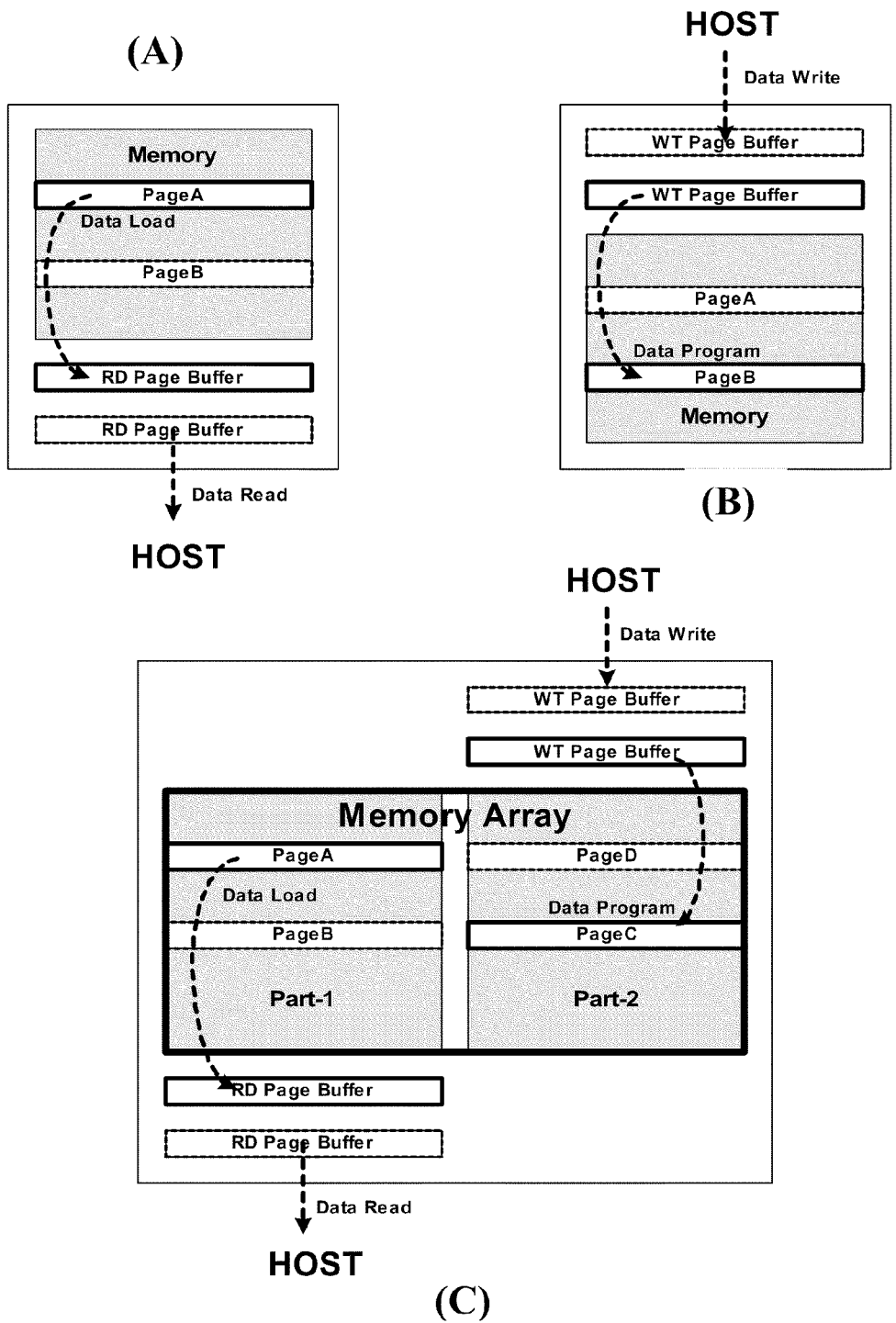
FIG. 10A shows a diagram of the NAND/NOR Read-While-Load operation in the present invention.
FIG. 10B shows a diagram of NAND/NOR Write-While-Program operation in the present invention.
FIG. 10C shows a diagram of NAND/NOR dual part operation in the present invention.
FIG. 10D shows a diagram of NAND/NOR Read-While-Load section operation in the present invention.
FIG. 10E shows a diagram of NAND/NOR Write-While-Program section operation in the present invention.
FIG. 10F shows a diagram of NAND/NOR dual part section operation in the present invention.

FIG. 10A illustrates the NAND or NOR Read-While-Load operation according to the present invention. The NAND and NOR memories have independent dual RD page buffers that enable higher performance read operation. The Read-While-Load operation improves the read performance of the memory by enabling data to be read out by the host from one RD page buffer while the other RD page buffer is being loaded with data from the memory system of the present invention. The dual page buffer architecture provides the capability of executing a data-read operation from one of the RD page buffers during a simultaneous data-load operation from the flash memory to the other RD page buffer. Simultaneous load and read operation to the same RD page buffer is prohibited.

FIG. 10B illustrates the NAND or NOR Write-While-Program operation according to the present invention. The NAND or NOR memories have independent dual WT page buffers that enable higher performance program operation, The Write-While-Program operation accelerates the program by enabling data to be written by the host into one WT page buffer while the flash memory is being programmed with data from the other WT page buffer. The dual page buffer architecture provides the capability of executing a data-write operation to one of the WT page buffers during a simultaneous data-program operation to the flash memory from the other WT page buffer. Simultaneous program and write operation to the same WT page buffer is prohibited.

Another innovative feature in the present invention is a dual part architecture for the NAND and NOR memories that are allowed to execute a Load/Read/Read-While-Load operation on one part during a simultaneous Program/Write/Write-While-Program operation on another part.

FIG. 10C illustrates the NAND or NOR dual part operation according to the present invention. The NAND or NOR array memory is divided into two parts, part-1 and part-2. The independent memory parts enable higher performance dual operation. The dual operation accelerates the program and read performance by enabling a Load/Read/Read-While-Load operation to be executed by one memory part while the other memory part is performing a Program/Write/Write-While-Program operation. The half-to-half array architecture provides the capability of executing a Load/Read/Read-While-Load operation on one of the memory parts with the dual RD page buffers during a simultaneous Program/Write/Write-While-Program operation to the other part with the dual WT page buffers. Simultaneous Load/Read/Read-While-Load and Program/Write/Write-While-Program operation to the same memory part is prohibited.

The present invention also provides a Read-While-Load section operation with a single RD page buffer that enables the execution of a data-read operation from one section of the RD page buffer during a simultaneous data-load operation from the flash memory to the other section of the RD page buffer. This operation accelerates the read speed and saves one RD page buffer. Similarly, a Write-While-Program section operation with a single WT page buffer is provided to enable the execution of a data-write operation to one section of a WT page buffer during a simultaneous data-program operation to the flash memory from the other section of the WT page buffer. This operation accelerates the program speed and saves one WT page buffer.

FIG. 10D illustrates the NAND or NOR Read-While-Load section operation according to the present invention. Because the data unit in the present invention can be down to a single section, the Read-While-Load operation can be performed with a single RD page buffer. The Read-While-Load section operation enables data to be read out by the host from one section of a RD page buffer while the other section of the RD page buffer is being loaded with data from the memory system. The section unit architecture provides the capability of executing a data-read operation from one section of the RD page buffer during a simultaneous data-load operation from the flash memory to the other section of the RD page buffer. Simultaneous load and read operation to the same section is prohibited.

FIG. 10E illustrates NAND or NOR Write-While-Program section operation. Because the data unit in the present invention can be down to a single section, the Write-While-Program operation can be performed with a single WT page buffer. The Write-While-Program section operation enables data to be written by the host into one section of a WT page buffer while the flash memory is being programmed with data from the other section of the WT page buffer. The section unit architecture provides the capability of executing a data-write operation to one section of the WT page buffer during a simultaneous data-program operation to the flash memory from the other section of the WT page buffer. Simultaneous program and write operation to the same section is prohibited.

FIG. 10F illustrates the NAND or NOR dual part section operation. The NAND or NOR array memory is divided into two parts, part-1 and part-2. The independent memory parts enable higher performance dual part section operation. The dual part section operation accelerates the program and read section operation speed by enabling a Load/Read/Read-While-Load section operation to be executed by a section of one memory part while another section of the other memory part is performing a Program/Write/Write-While-Program section operation. The half-to-half array architecture provides the capability of executing a Load/Read/Read-While-Load section operation on one memory part with a single RD page buffer during a simultaneous Program/Write/Write-While-Program section operation to another section of the other part with a single WT page buffer. Simultaneous Load/Read/Read-While-Load and Program/Write/Write-While-Program section operation to the same memory part is prohibited.

According to the present invention, a unique RY/BY# checking mechanism is provided to allow the host to be informed when the first write operation is completed instead of waiting until after all the write operations are completed. This mechanism improves the response speed of the system greatly.

Figure 11:
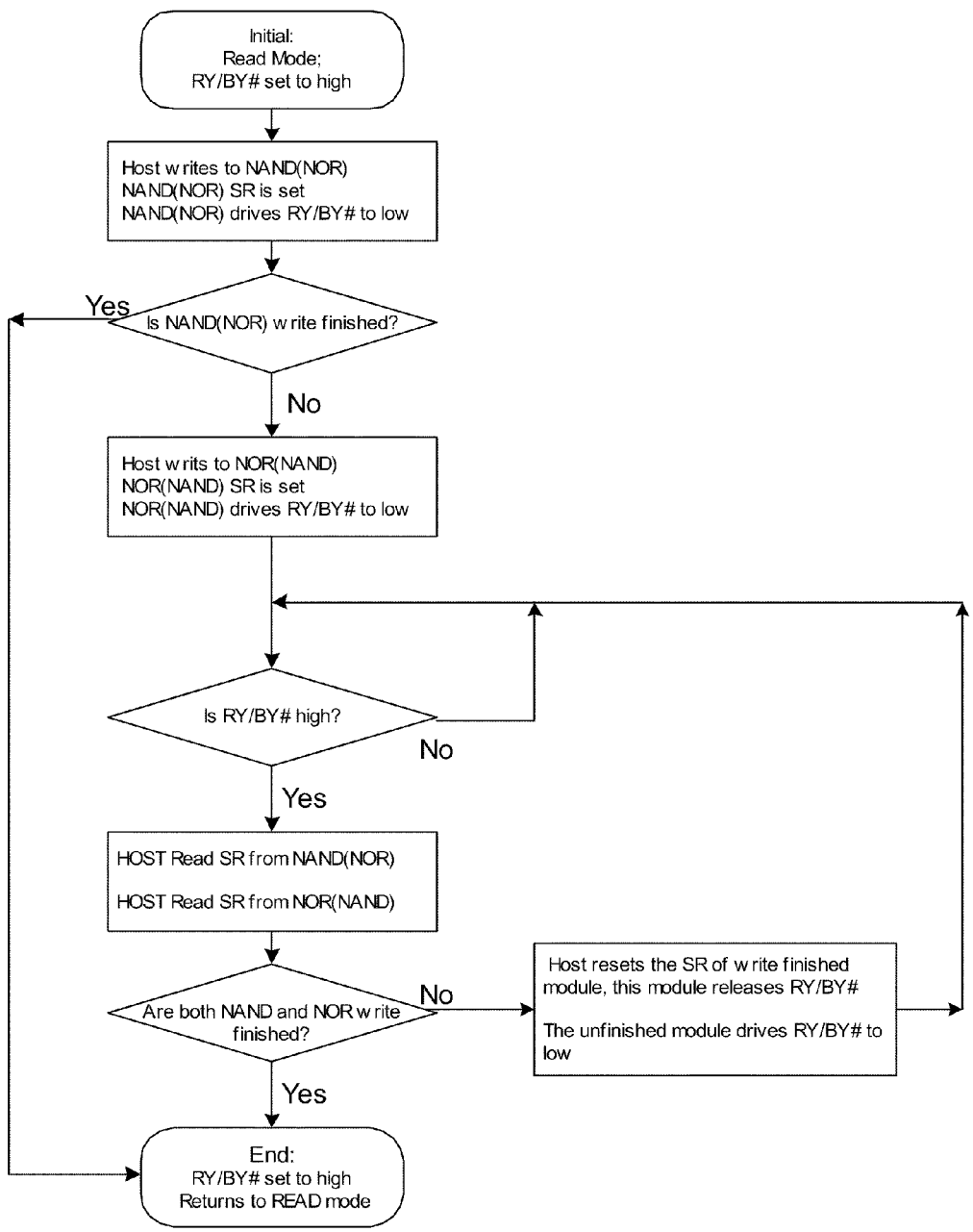
FIG. 11 shows a flow diagram of NAND and NOR memory writing at the same time and how to check RY/BY# in the present invention.

FIG. 11 shows the flow diagram for the RY/BY# signal checking mechanism when NAND and NOR memories are all in writing process in the present invention. The NOR and NAND memories can do their write (erase or program) operation independently. For example, if a NAND (or NOR) write command is followed by a NOR (or NAND) write command, the NAND and NOR will set their own status registers and RY/BY# to low. Once NAND or NOR memory has first finished the write operation, the external RY/BY# will be driven high by the finished one and trigger the host interrupt. The host will send the read status register commands to check the status of NAND and NOR memories. If the NAND or NOR memory has finished the write operation while the other one is still in write processing, the host will record and reset the status register of the finished one and it will release the external RY/BY# for the unfinished one. The unfinished one will drive RY/BY# to low, and RY/BY# will be set to high when the unfinished write operation is completed.

Although the present invention has been described with reference to the exemplary embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A memory system on a single chip, comprising:
   a NAND flash memory having a status register and a plurality of NAND cells, said plurality of NAND cells having a plurality of bit lines, a plurality of source lines in parallel with said bit lines, and a plurality of word lines perpendicular to said bit lines and said source lines;
   a NOR flash memory having a status register and a plurality of NOR cells, each of said NOR cells being formed by a symmetrical 2-NAND cell string and having a drain connected to a bit line, a source connected to a source line in parallel with said bit line and two floating gates connected to two word lines perpendicular to said bit line and said source line;

an address bus shared by said NAND and NOR flash memories, and a data bus shared by said NAND and NOR flash memories;

wherein both said address bus and said data bus are bi-directional for receiving external inputs to said memory system and transmitting outputs from said memory system, and said NAND and NOR flash memories are manufactured by a unified NAND manufacturing process and same NAND cells.

2. The memory system on a single die as claimed in claim 1, wherein said NAND and NOR flash memories use a same FN-tunneling scheme to perform page program, page erase and block erase operations.

3. The memory system on a single die as claimed in claim 1, wherein said memory system has NAND-based software commands for providing compatible NOR-based command set and NAND-based command set.

4. The memory system on a single die as claimed in claim 1, wherein said address bus is used for receiving code, data and address of said NAND and NOR flash memories, and outputting content of said status registers of said NAND and NOR flash memories.

5. The memory system on a single die as claimed in claim 1, wherein said memory system has an asynchronous status register read command for reading out content of said status register of said NAND flash memory or said NOR flash memory from said address bus.

6. The memory system on a single die as claimed in claim 1, wherein said single chip has one single external output enable (OE) pin and one single external chip enable (CE) pin shared by said NAND and NOR flash memories.

7. The memory system on a single die as claimed in claim 6, wherein said NAND and NOR flash memories are selected by a memory-mapped method using different addresses together with said single external OE pin and said single external CE pin.

8. The memory system on a single die as claimed in claim 6, wherein said status register of said NAND flash memory and said status register of said NOR flash memory are selected by a memory-mapped method using different addresses together with said single external OE pin and said single external CE pin.

9. The memory system on a single die as claimed in claim 1, wherein said single chip has a plurality of pins shared by said NAND and NOR flash memories, and definition of said plurality of pins are based on pin definition of said NOR flash memory with additional pin definition added to meet requirements for said NAND flash memory.

10. The memory system on a single die as claimed in claim 1, wherein said single chip has separate internal RY/BY# signals for said NAND and NOR flash memories inside said single chip with an external RY/BY# pin shared by said NAND and NOR flash memories.

11. The memory system on a single die as claimed in claim 10, wherein a host issues an instruction to determine if said NAND flash memory or said NOR flash memory has a completed write operation that activates said external RY/BY# pin, and then resets said external RY/BY# pin to wait for completion of an additional write operation of said NAND flash memory or said NOR flash memory.

12. The memory system on a single die as claimed in claim 1, wherein said memory system has a synchronous read command for reading said NAND and NOR flash memories simultaneously by outputting data of said NAND and NOR flash memories alternatively on said data bus.

13. The memory system on a single die as claimed in claim 1, wherein said NAND flash memory further comprises dual read page buffers.

14. The memory system on a single die as claimed in claim 13, wherein said single chip has one single external output enable (OE) pin and one single external chip enable (CE) pin shared by said NAND and NOR flash memories.

15. The memory system on a single die as claimed in claim 14, wherein said dual read page buffers of said NAND flash memory are selected by a memory-mapped method using different addresses together with said single external OE pin and said single external CE pin.

16. The memory system on a single die as claimed in claim 13, wherein said NAND flash memory further comprises a Read-While-Load operation for executing a data-read operation from one of said dual read page buffers during a simultaneous data-load operation from said NAND flash memory to the other read page buffer.

17. The memory system on a single die as claimed in claim 13, wherein said NAND flash memory further comprises a Read-While-Load section operation with one of said dual read page buffers for executing a data-read operation from one section of said one read page buffer during a simultaneous data-load operation from said NAND flash memory to another section of said one read page buffer.

18. The memory system on a single die as claimed in claim 1, wherein said NAND flash memory further comprises dual write page buffers.

19. The memory system on a single die as claimed in claim 18, wherein said single chip has one single external output enable (OE) pin and one single external chip enable (CE) pin shared by said NAND and NOR flash memories.

20. The memory system on a single die as claimed in claim 19, wherein said dual write page buffers of said NAND flash memory are selected by a memory-mapped method using different addresses together with said single external OE pin and said single external CE pin.

21. The memory system on a single die as claimed in claim 18, wherein said NAND flash memory further comprises a Write-While-Program operation for executing a data-write operation to one of said dual write page buffers during a simultaneous data-program operation to said NAND flash memory from the other write page buffer.

22. The memory system on a single die as claimed in claim 18, wherein said NAND flash memory further comprises dual read page buffers, said NAND flash memory is divided into two parts, and said memory system has a Load/Read/Read-While-Load dual-part operation on one part of said NAND flash memory for executing a data-read operation from one of said dual read page buffers during a simultaneous data-load operation from said one part of said NAND flash memory to the other read page buffer; while a simultaneous Program/Write/Write-While-Program operation on the other part of said NAND flash memory for executing a data-write operation to one of said dual write page buffers during a simultaneous data-program operation to the other part of said NAND flash memory from the other write page buffer.

23. The memory system on a single die as claimed in claim 18, wherein said NAND flash memory further comprises a Write-While-Program section operation with one of said dual write page buffers for executing a data-write operation to one section of said one write page buffer during a simultaneous data-program operation to said NAND flash memory from another section of said one write page buffer.

24. The memory system on a single die as claimed in claim 18, wherein said NAND flash memory further comprises dual read page buffers, said NAND flash memory is divided into two parts, and said memory system has a Load/Read/Read-While-Load dual-part section operation with one of said dual read page buffers on one part of said NAND flash memory for executing a data-read operation from one section of said one read page buffer during a simultaneous data-load operation from said one part of said NAND flash memory to another section of said one read page buffer; while a simultaneous Program/Write/Write-While-Program section operation with one of said dual write page buffers on the other part of said NAND flash memory for executing a data-write operation to one section of said one write page buffer during a simultaneous data-program operation to the other part of said NAND flash memory from another section of said one write page buffer.

25. The memory system on a single die as claimed in claim 1, wherein said NOR flash memory further comprises dual read page buffers.

26. The memory system on a single die as claimed in claim 25, wherein said single chip has one single external output enable (OE) pin and one single external chip enable (CE) pin shared by said NAND and NOR flash memories.

27. The memory system on a single die as claimed in claim 26, wherein said dual read page buffers of said NOR flash memory are selected by a memory-mapped method using different addresses together with said single external OE pin and said single external CE pin.

28. The memory system on a single die as claimed in claim 25, wherein said NOR flash memory further comprises a Read-While-Load operation for executing a data-read operation from one of said dual read page buffers during a simultaneous data-load operation from said NOR flash memory to the other read page buffer.

29. The memory system on a single die as claimed in claim 25, wherein said NOR flash memory further comprises a Read-While-Load section operation with one of said dual read page buffers for executing a data-read operation from one section of said one read page buffer during a simultaneous data-load operation from said NOR flash memory to another section of said one read page buffer.

30. The memory system on a single die as claimed in claim 1, wherein said NOR flash memory further comprises dual write page buffers.

31. The memory system on a single die as claimed in claim 30, wherein said single chip has one single external output enable (OE) pin and one single external chip enable (CE) pin shared by said NAND and NOR flash memories.

32. The memory system on a single die as claimed in claim 31, wherein said dual write page buffers of said NOR flash memory are selected by a memory-mapped method using different addresses together with said single external OE pin and said single external CE pin.

33. The memory system on a single die as claimed in claim 30, wherein said NOR flash memory further comprises a Write-While-Program operation for executing a data-write operation to one of said dual write page buffers during a simultaneous data-program operation to said NOR flash memory from the other write page buffer.

34. The memory system on a single die as claimed in claim 30, wherein said NOR flash memory further comprises dual read page buffers, said NOR flash memory is divided into two parts, and said memory system has a Load/Read/Read-While-Load dual-part operation on one part of said NOR flash memory for executing a data-read operation from one of said dual read page buffers during a simultaneous data-load operation from said one part of said NOR flash memory to the other read page buffer; while a simultaneous Program/Write/Write-While-Program operation on the other part of said NOR flash memory for executing a data-write operation to one of said dual write page buffers during a simultaneous data-program operation to the other part of said NOR flash memory from the other write page buffer.

35. The memory system on a single die as claimed in claim 30, wherein said NOR flash memory further comprises a Write-While-Program section operation with one of said dual write page buffers for executing a data-write operation to one section of said one write page buffer during a simultaneous data-program operation to said NOR flash memory from another section of said one write page buffer.

36. The memory system on a single die as claimed in claim 30, wherein said NOR flash memory further comprises dual read page buffers, said NOR flash memory is divided into two parts, and said memory system has a Load/Read/Read-While-Load dual-part section operation with one of said dual read page buffers on one part of said NOR flash memory for executing a data-read operation from one section of said one read page buffer during a simultaneous data-load operation from said one part of said NOR flash memory to another section of said one read page buffer; while a simultaneous Program/Write/Write-While-Program section operation with one of said dual write page buffers on the other part of said NOR flash memory for executing a data-write operation to one section of said one write page buffer during a simultaneous data-program operation to the other part of said NOR flash memory from another section of said one write page buffer.

37. The memory system on a single die as claimed in claim 1, further comprising a SRAM having a plurality of SRAM cells integrated in said single die.

38. The memory system on a single die as claimed in claim 37, wherein said NAND and NOR flash memories use a same FN-tunneling scheme to perform page program, page erase and block erase operations.

39. The memory system on a single die as claimed in claim 37, wherein said memory system has NAND-based software commands for providing compatible NOR-based command set and NAND-based command set.

40. The memory system on a single die as claimed in claim 37, wherein said address bus and said data bus are shared by said NOR and NAND flash memories, and said SRAM.

41. The memory system on a single die as claimed in claim 37, wherein said address bus is used for receiving code, data and address of said NAND and NOR flash memories, and address of said SRAM, and outputting content of said status registers of said NAND and NOR flash memories.

42. The memory system on a single die as claimed in claim 37, wherein said memory system has an asynchronous status register read command for reading out content of said status register of said NAND flash memory or said NOR flash memory from said address bus.

43. The memory system on a single die as claimed in claim 37, wherein said single chip has one single external output enable (OE) pin and one single external chip enable (CE) pin shared by said NAND and NOR flash memories, and said SRAM.

44. The memory system on a single die as claimed in claim 43, wherein said NAND and NOR flash memories, and said SRAM are selected by a memory-mapped method using different addresses together with said single external OE pin and said single external CE pin.

45. The memory system on a single die as claimed in claim 43, wherein said status register of said NAND flash memory and said status register of said NOR flash memory are selected by a memory-mapped method using different addresses together with said single external OE pin and said single external CE pin.

46. The memory system on a single die as claimed in claim 37, wherein said single chip has a plurality of pins shared by said NAND and NOR flash memories, and said SRAM, and definition of said plurality of pins are based on pin definition of said NOR flash memory with additional pin definition added to meet requirements for said NAND flash memory and said SRAM.

47. The memory system on a single die as claimed in claim 37, wherein said single chip has separate internal RY/BY# signals for said NAND and NOR flash memories inside said single chip with an external RY/BY# pin shared by said NAND and NOR flash memories.

48. The memory system on a single die as claimed in claim 47, wherein a host issues an instruction to determine if said NAND flash memory or said NOR flash memory has a completed write operation that activates said external RY/BY# pin, and then resets said external RY/BY# pin to wait for competition of an additional operation of said NAND flash memory or said NOR flash memory.

49. The memory system on a single die as claimed in claim 37, wherein said memory system has a synchronous read command for reading said NAND and NOR flash memories simultaneously by outputting data of said NAND and NOR flash memories alternatively on said data bus.

50. The memory system on a single die as claimed in claim 37, wherein said NAND flash memory further comprises dual read page buffers.

51. The memory system on a single die as claimed in claim 50, wherein said single chip has one single external output enable (OE) pin and one single external chip enable (CE) pin shared by said NAND and NOR flash memories, and said SRAM.

52. The memory system on a single die as claimed in claim 51, wherein said dual read page buffers of said NAND flash memory are selected by a memory-mapped method using different addresses together with said single external OE pin and said single external CE pin.

53. The memory system on a single die as claimed in claim 50, wherein said NAND flash memory further comprises a Read-While-Load operation for executing a data-read operation from one of said dual read page buffers during a simultaneous data-load operation from said NAND flash memory to the other read page buffer.

54. The memory system on a single die as claimed in claim 50, wherein said NAND flash memory further comprises a Read-While-Load section operation with one of said dual read page buffers for executing a data-read operation from one section of said one read page buffer during a simultaneous data-load operation from said NAND flash memory to another section of said one read page buffer.

55. The memory system on a single die as claimed in claim 37, wherein said NAND flash memory further comprises dual write page buffers.

56. The memory system on a single die as claimed in claim 55, wherein said single chip has one single external output enable (OE) pin and one single external chip enable (CE) pin shared by said NAND and NOR flash memories, and said SRAM.

57. The memory system on a single die as claimed in claim 56, wherein said dual write page buffers of said NAND flash memory are selected by a memory-mapped method using different addresses together with said single external OE pin and said single external CE pin.

58. The memory system on a single die as claimed in claim 55, wherein said NAND flash memory further comprises a Write-While-Program operation for executing a data-write operation to one of said dual write page buffers during a simultaneous data-program operation to said NAND flash memory from the other write page buffer.

59. The memory system on a single die as claimed in claim 55, wherein said NAND flash memory further comprises dual read page buffers, said NAND flash memory is divided into two parts, and said memory system has a Load/Read/Read-While-Load dual-part operation on one part of said NAND flash memory for executing a data-read operation from one of said dual read page buffers during a simultaneous data-load operation from said one part of said NAND flash memory to the other read page buffer; while a simultaneous Program/Write/Write-While-Program operation on the other part of said NAND flash memory for executing a data-write operation to one of said dual write page buffers during a simultaneous data-program operation to the other part of said NAND flash memory from the other write page buffer.

60. The memory system on a single die as claimed in claim 55, wherein said NAND flash memory further comprises a Write-While-Program section operation with one of said dual write page buffers for executing a data-write operation to one section of said one write page buffer during a simultaneous data-program operation to said NAND flash memory from another section of said one write page buffer.

61. The memory system on a single die as claimed in claim 55, wherein said NAND flash memory further comprises dual read page buffers, said NAND flash memory is divided into two parts, and said memory system has a Load/Read/Read-While-Load dual-part section operation with one of said dual read page buffers on one part of said NAND flash memory for executing a data-read operation from one section of said one read page buffer during a simultaneous data-load operation from said one part of said NAND flash memory to another section of said one read page buffer; while a simultaneous Program/Write/Write-While-Program section operation with one of said dual write page buffers on the other part of said NAND flash memory for executing a data-write operation to one section of said one write page buffer during a simultaneous data-program operation to the other part of said NAND flash memory from another section of said one write page buffer.

62. The memory system on a single die as claimed in claim 37, wherein said NOR flash memory further comprises dual read page buffers.

63. The memory system on a single die as claimed in claim 62, wherein said single chip has one single external output enable (OE) pin and one single external chip enable (CE) pin shared by said NAND and NOR flash memories, and said SRAM.

64. The memory system on a single die as claimed in claim 63, wherein said dual read page buffers of said NOR flash memory are selected by a memory-mapped method using different addresses together with said single external OE pin and said single external CE pin.

65. The memory system on a single die as claimed in claim 62, wherein said NOR flash memory further comprises a Read-While-Load operation for executing a data-read operation from one of said dual read page buffers during a simultaneous data-load operation from said NOR flash memory to the other read page buffer.

66. The memory system on a single die as claimed in claim 62, wherein said NOR flash memory further comprises a Read-While-Load section operation with one of said dual read page buffers for executing a data-read operation from one section of said one read page buffer during a simultaneous data-load operation from said NOR flash memory to another section of said one read page buffer.

67. The memory system on a single die as claimed in claim 37, wherein said NOR flash memory further comprises dual write page buffers.

68. The memory system on a single die as claimed in claim 67, wherein said single chip has one single external output enable (OE) pin and one single external chip enable (CE) pin shared by said NAND and NOR flash memories, and said SRAM.

69. The memory system on a single die as claimed in claim 68, wherein said dual write page buffers of said NOR flash memory are selected by a memory-mapped method using different addresses together with said single external OE pin and said single external CE pin.

70. The memory system on a single die as claimed in claim 67, wherein said NOR flash memory further comprises a Write-While-Program operation for executing a data-write operation to one of said dual write page buffers during a simultaneous data-program operation to said NOR flash memory from the other write page buffer.

71. The memory system on a single die as claimed in claim 67, wherein said NOR flash memory further comprises dual read page buffers, said NOR flash memory is divided into two parts, and said memory system has a Load/Read/Read-While-Load dual-part operation on one part of said NOR flash memory for executing a data-read operation from one of said dual read page buffers during a simultaneous data-load operation from said one part of said NOR flash memory to the other read page buffer; while a simultaneous Program/Write/Write-While-Program operation on the other part of said NOR flash memory for executing a data-write operation to one of said dual write page buffers during a simultaneous data-program operation to the other part of said NOR flash memory from the other write page buffer.

72. The memory system on a single die as claimed in claim 67, wherein said NOR flash memory further comprises a Write-While-Program section operation with one of said dual write page buffers for executing a data-write operation to one section of said one write page buffer during a simultaneous data-program operation to said NOR flash memory from another section of said one write page buffer.

73. The memory system on a single die as claimed in claim 67, wherein said NOR flash memory further comprises dual read page buffers, said NOR flash memory is divided into two parts, and said memory system has a Load/Read/Read-While-Load dual-part section operation with one of said dual read page buffers on one part of said NOR flash memory for executing a data-read operation from one section of said one read page buffer during a simultaneous data-load operation from said one part of said NOR flash memory to another section of said one read page buffer; while a simultaneous Program/Write/Write-While-Program section operation with one of said dual write page buffers on the other part of said NOR flash memory for executing a data-write operation to one section of said one write page buffer during a simultaneous data-program operation to the other part of said NOR flash memory from another section of said one write page buffer.

* * * * *